US008935468B2

(12) United States Patent
Maydan et al.

(10) Patent No.: US 8,935,468 B2
(45) Date of Patent: Jan. 13, 2015

(54) AUDIO DIGITAL SIGNAL PROCESSOR

(71) Applicant: Tensilica, Inc., Santa Clara, CA (US)

(72) Inventors: Dror E. Maydan, Palo Alto, AZ (US); William A. Huffman, Los Gatos, CA (US); Sachin Ghanekar, Maharashtra (IN); Fei Sun, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 188 days.

(21) Appl. No.: 13/731,616

(22) Filed: Dec. 31, 2012

(65) Prior Publication Data

US 2014/0189231 A1   Jul. 3, 2014

(51) Int. Cl.
*G06F 12/00* (2006.01)
*G11C 21/00* (2006.01)
*G06F 13/00* (2006.01)
*G06F 13/28* (2006.01)

(52) U.S. Cl.
CPC ...................................... *G11C 21/00* (2013.01)
USPC ................. 711/110; 712/2; 712/35; 712/204; 379/88.07

(58) Field of Classification Search
CPC ....................................................... G11C 21/00
USPC .............. 711/110; 712/2, 35, 204; 379/88.07
See application file for complete search history.

(56) References Cited

U.S. PATENT DOCUMENTS

| | | | |
|---|---|---|---|
| 4,814,976 A | 3/1989 | Hansen et al. | |
| 6,260,137 B1 * | 7/2001 | Fleck et al. | 712/225 |
| 6,330,623 B1 * | 12/2001 | Wu et al. | 710/23 |
| 6,477,683 B1 | 11/2002 | Killian et al. | |
| 6,477,697 B1 | 11/2002 | Killian et al. | |
| 6,772,247 B2 * | 8/2004 | Ng | 710/66 |
| 6,965,987 B2 * | 11/2005 | Senter et al. | 712/245 |
| 7,219,212 B1 * | 5/2007 | Sanghavi et al. | 712/6 |
| 7,346,881 B2 | 3/2008 | Wang et al. | |
| 7,376,812 B1 | 5/2008 | Sanghavi et al. | |
| 7,774,748 B1 | 8/2010 | Goodwin | |
| 8,250,342 B1 * | 8/2012 | Kostarnov et al. | 712/35 |
| 2005/0080953 A1 * | 4/2005 | Oner et al. | 710/52 |

OTHER PUBLICATIONS

"CEVA-TeakLite-III, Digital Signal Processing Core," Berkeley Design Technology, Inc., pp. 1-7, 2009.
"CEVA-HD-Audio Platform," product literature, 40 pages, Mar. 2009.

* cited by examiner

*Primary Examiner* — Yaima Rigol
*Assistant Examiner* — Mark Giardino, Jr.
(74) *Attorney, Agent, or Firm* — Sawyer Law Group, P.C.

(57) ABSTRACT

A microprocessor includes a memory interface to obtain data envelopes of a first length, and control logic to implement an instruction to load an initial data envelope of a stream of data values into a buffer, each data value having a second length shorter than the first length, the stream of data values being disposed across successive data envelopes at the memory interface. Another instruction merges current contents of the buffer and the memory interface such that each invocation loads one of the data values into a first register, and moves at least a remainder of the current contents of the memory interface into the buffer for use in a successive invocation. Another instruction loads a reversed representation of a set of data values obtained via the memory interface into a second register. Another instruction implements an FIR computation including a SIMD operation involving multiple data values of the stream and the reversed representation.

34 Claims, 9 Drawing Sheets

AUDIO DIGITAL SIGNAL PROCESSOR

BACKGROUND OF THE DISCLOSURE

Brief Description of Related Technology

Digital signal processors (DSPs) are often designed for efficient processing of audio data. Specialized audio DSPs are commonly found in cell phones, televisions, and automobiles. Audio DSPs perform tasks such as decoding compressed music formats, reducing background noise, and adding post-processing effects, to improve overall sound quality.

The computer processing demands of commonly used audio algorithms have greatly increased. Simple, low-fidelity, stereo music has been supplanted with high fidelity, multichannel audio. The competitive marketplace has placed a premium on higher fidelity, leading to the need for more sophisticated post-processing algorithms. These demands have driven an interest in significantly more powerful audio processors. However, the increasing importance of small, mobile devices has driven an interest in minimizing power and memory consumption.

Traditional DSPs have increased performance by increasing the number of operations executed in parallel and by increasing the operating frequency of the hardware. These techniques improve performance but also increase power consumption.

Traditional audio DSPs have improved fidelity by extending the precision of the audio data. Audio DSPs once stored audio samples with 16-bit precision, but now often support 24-bit precision. Such higher precision has resulted in larger memory requirements and also increased power consumption. Moreover, 24-bit precision leads to wasted memory, insofar as memory units are configured with power-of-two sized bundles, such as 32-bit units.

SUMMARY OF THE DISCLOSURE

In accordance with one aspect, a microprocessor includes a memory interface to load or store data envelopes from or to a memory, each data envelope having a first length, a plurality of registers, a buffer, and control logic configured to implement a plurality of instructions to load or store a stream of data elements via a succession of the data envelopes at the memory interface, each data element having a second length in one of the plurality of registers shorter than the first length of the data envelopes at the memory interface, the first length not being an integer multiple of the second length. The plurality of instructions include an initialization instruction configured to initialize the buffer in a load operation in which an initial envelope is loaded into the buffer, the initial envelope including a first byte of a first data element of the stream of data elements, or in a store operation in which the buffer is cleared, and a data merge instruction configured to extract or incorporate a respective data element from or into the stream of data elements in the load operation or the store operation, respectively. The data merge instruction is configured to merge current contents of the buffer and the memory interface into a first register of the plurality of registers in the load operation or is configured to merge current contents of the buffer and a second register of the plurality of registers into the memory interface in the store operation, and is further configured to move at least a remainder of the current contents of either the memory interface or the second register into the buffer for use in a successive invocation of the data merge instruction.

In some embodiments, the microprocessor may further include an address register for the memory interface. The data merge instruction may be further configured to increment the address register in accordance with the second length. The plurality of instructions may further include a flush instruction configured to flush any data remaining in the buffer upon reaching an end of the stream of data elements to be stored during implementation of the store operation. The data merge instruction may be further configured to determine whether, in the load operation, the buffer includes an entire representation of the data element such that no further data is required from the memory interface, or whether, in the store operation, whether any further data is moved to the memory interface. Each data element may be a vector data element including multiple data values. The first length may be 64 bits and the second length may be 48 bits. Alternatively, each data element may be a vector data element including a pair of 24-bit scalar data elements. Each register may have a size greater than the second length to provide space for one or more guard bits. The data merge instruction may be further configured in the load operation to set extra bits in the first register to sign-extended values. The first length may be 32 bits and the second length may be 24 bits.

In accordance with another aspect, a method is useful for loading or storing a stream of data elements to or from a microprocessor, respectively, via a succession of data envelopes at a memory interface of the microprocessor, each data envelope having a first length, each data element of the stream of data elements having a second length in one of a plurality of registers of the microprocessor shorter than the first length, the first length not being an integer multiple of the second length. The method includes initializing a buffer of the microprocessor in a store operation in which the buffer is cleared, or in a load operation in which an initial data envelope of the succession is loaded into the buffer, the initial data envelope including a first byte of a first data element of the stream of data elements, merging, in the load operation, current contents of the buffer and the memory interface in the load operation to extract a respective data element from the stream of data elements into a first register of the plurality of registers, or in the store operation, current contents of the buffer and a second register of the plurality of registers to incorporate a respective data element into the stream at the memory interface, and moving at least a remainder of the current contents of either the memory interface or the second register into the buffer for use in a successive implementation of the load operation or the store operation.

In some embodiments, the method may further include incrementing an address register of the microprocessor for the memory interface in accordance with the second length. The method may further include flushing any data remaining in the buffer upon reaching an end of the stream of data elements to be stored in implementation of the store operation. Merging the current contents of the buffer and the memory interface may include determining, whether, in the load operation, the buffer includes an entire representation of the data element such that no further data is required from the memory interface, or whether, in the store operation, whether any further data is moved to the memory interface.

In accordance with another aspect, a computer-readable storage medium includes instructions defining logic blocks of a microprocessor, the instructions being configured for use by an electronic design application executed by a computer to design the microprocessor. The logic blocks are configured to implement a method of loading or storing a stream of data elements via a succession of data envelopes at a memory interface of the microprocessor, each data envelope having a first length, each data element of the stream of data elements having a second length in one of a plurality of registers of the microprocessor shorter than the first length, the first length not being an integer multiple of the second length. The method includes initializing a buffer of the microprocessor in a store operation in which the buffer is cleared, or in a load operation in which an initial data envelope of the succession is loaded into the buffer, the initial envelope including a first byte of a first data element of the stream of data elements, merging, in the load operation, current contents of the buffer and the memory interface in the load operation to unpack a respective data element from successive locations in the stream of data elements into a first register of the plurality of registers, or in the store operation, current contents of the buffer and a second register of the plurality of registers to pack a respective data element into successive locations in the stream at the memory interface, and moving at least a remainder of the current contents of either the memory interface or the second register into the buffer for use in a successive implementation of the load operation or the store operation.

In connection with the computer-readable storage medium, in some embodiments, the method may further include incrementing an address register of the microprocessor for the memory interface in accordance with the second length. The method may further include flushing any data remaining in the buffer upon reaching an end of the stream of data elements to be stored in implementation of the store operation. Merging the current contents of the buffer and the memory interface may include determining, whether, in the load operation, the buffer includes an entire representation of the data element such that no further data is required from the memory interface, or whether, in the store operation, whether any further data is moved to the memory interface.

In accordance with another aspect, a microprocessor includes a memory interface to load or store a vector of data elements from or to a memory, a register, and control logic configured to implement a load instruction or a store instruction in either a first element order or a second element order in accordance with a control signal, the second element order being reversed relative to the first element order, the load instruction or the store instruction being configured to access the vector of data elements from the memory interface or the register and to deposit the vector of data elements in the register or the memory interface, respectively, in either the first element order or the second element order based on the control signal.

In some embodiments, each data element of the vector may include multiple bytes. The data elements of the vector may be flipped on multiple-byte boundaries when arranged in the second element order. Each data element may have a length of two bytes. The control logic may be further configured to update an address register during implementation of the load instruction or the store instruction. The control logic may be configured to implement the load instruction or the store instruction during an unpacking load operation or a packing store operation in which the data elements are unpacked from, or packed into, a continuous stream of data elements, respectively, despite having a length shorter than a length of the memory interface. The control logic may include a decoder responsive to the control signal and configured to determine whether the load instruction or the store instruction is to be implemented in the normal element order or the reverse element order. The vector may include four data elements. The control logic may be configured in accordance with a four-way single-instruction, multiple data (SIMD) width. Each data element may specify a respective filter coefficient for implementation of a finite impulse response (FIR) filter operation.

In accordance with another aspect, a method includes accessing a vector of data elements from a memory interface or a register of a microprocessor, receiving a control signal to implement a load instruction or a store instruction in either a first element order or a second element order for the vector of data elements, the second element order being reversed relative to the first element order, and depositing the vector of data elements in the register or the memory interface with the data elements arranged in the first element order or the second element order based on the control signal.

In some embodiments, each data element of the vector may include multiple bytes. The data elements of the vector may be flipped on multiple-byte boundaries when arranged in the second element order. The method may further include updating an address register during implementation of the load instruction or the store instruction. The vector of data elements may be obtained and moved as part of an unpacking load operation or a packing store operation in which the data elements are unpacked from, or packed into, a continuous stream of data elements, respectively, despite having a length shorter than a length of the memory interface. Receiving the control signal may include decoding the control signal with a decoder of control logic of the microprocessor responsive to the control signal and configured to determine whether the load instruction or the store instruction is to be implemented in the first element order or the second element order.

In accordance with another aspect, a computer-readable storage medium includes instructions defining logic blocks of a microprocessor, the instructions being configured for use by an electronic design application executed by a computer to design the microprocessor. The logic blocks are configured to implement a method of loading or storing a vector of data elements via a memory interface of the microprocessor. The method includes obtaining the vector of data elements from the memory interface or a register of the microprocessor, receiving a control signal to implement a load instruction or a store instruction in either a first element order or a second element order for the vector of data elements, the second element order being reversed relative to the first element order, and moving the vector of data elements to the register or the memory interface with the data elements arranged in the normal element order or the reverse element order based on the control signal.

In connection with the computer-readable storage medium, in some embodiments, each data element of the vector may include multiple bytes. The data elements of the vector may be flipped on multiple-byte boundaries when arranged in the reverse element order. The method may further include updating an address register during implementation of the load instruction or the store instruction. The vector of data elements may be obtained and moved as part of an unpacking load operation or a packing store operation in which the data elements are unpacked from, or packed into, a continuous stream of data elements, respectively, despite having a length shorter than a length of the memory interface. Receiving the control signal may include decoding the control signal with a decoder of control logic of the microprocessor responsive to the control signal and configured to determine whether the load instruction or the store instruction is to be implemented in the first element order or the second element order.

In accordance with another aspect, a microprocessor includes a plurality of operand registers and control logic configured to implement a finite impulse response (FIR) filter operation via a convolution instruction configured to take first through fifth register operands from the plurality of operand registers, the first and second register operands being both read and written by the convolution instruction, and the third through fifth register operands being only read by the convolution instruction. The convolution instruction is further configured to increment the first register operand by a sum of a first product and a second product, the first and second products multiplying high and low halves of the third register operand, respectively, with either high and low halves of the fifth register operand or first and second quarters of the fifth register operand, respectively. The convolution instruction is further configured to increment the second register operand by a sum of a third product and a fourth product, the third and fourth products multiplying a low half of the third register operand and the high half of the fourth register operand, respectively, with either the high and low halves of the fifth register operand or the first and second quarters of the fifth register operand, respectively.

In some embodiments, the third and the fourth register operands correspond with respective audio data elements of a set of audio data elements for the FIR filter operation. The fifth register operand may correspond with a set of filter coefficients for the FIR filter operation. The control logic may be configured for at least two-way SIMD operations such that the convolution instruction is configured to implement a quadruple or higher multiply-accumulate (MAC) operation. Each half of the third and fourth register operands may be a 32-bit data value and each quarter of the fifth register operand is a 16-bit data value. Each half of the third and fourth register operands may be a 24-bit data value and each half of the fifth register operand may be a 24-bit data value. The control logic may be further configured to load a set of audio data elements into multiple registers of the plurality of operand registers in a first element order and further configured to load a set of filter coefficient elements in a second element order in a further register of the plurality of operand registers, the second element order being reversed relative to the first element order. The first element order may be a descending element order. The microprocessor may further include a memory interface having a first size, in which a first load instruction of the one or more load instructions is configured to unpack each register operand of the third through fifth register operands from one or more continuous data streams at the memory interface, and in which each register operand has a length shorter than a length of the memory interface. The control logic may be configured to implement a further convolution instruction to involving third and fourth quarters of the fifth register operand. Each operand register may have a length of 64 bits divided into a low data element and a high data element, or into four quarter data elements.

In accordance with another aspect, a method of implementing a finite impulse response (FIR) filter operation in a microprocessor includes accessing first through fifth register operands from a plurality of operand registers, the first and second register operands being both read and written in the FIR filter operation, and the third through fifth register operands being only read in the FIR filter operation, incrementing the first register operand by a sum of a first product and a second product, the first and second products multiplying high and low halves of the third register operand, respectively, with either high and low halves of the fifth register operand or first and second quarters of the fifth register operand, respectively, and Incrementing the second register operand by a sum of a third product and a fourth product, the third and fourth products multiplying a low half of the third register operand and the high half of the fourth register operand, respectively, with either the high and low halves of the fifth register operand or the first and second quarters of the fifth register operand, respectively.

In some embodiments, the third and the fourth register operands may correspond with respective audio data elements of a set of audio data elements for the FIR filter operation. The fifth register operand may correspond with a set of filter coefficients for the FIR filter operation. The microprocessor may be configured for at least two-way SIMD operations such that the FIR filter operation is configured to implement a quadruple or higher multiply-accumulate (MAC) operation. Each half of the third and fourth register operands may be a 32-bit data value and each quarter of the fifth register operand may be a 16-bit data value. Each half of the third and fourth register operands may be a 24-bit data value and each half of the fifth register operand may be a 24-bit data value. The method may further include loading a set of audio data elements into multiple registers of the plurality of operand registers in a first element order, and loading a set of filter coefficient elements in a second element order in a further register of the plurality of operand registers, the second element order being reversed relative to the first element order. The method may further include toggling which quarters of the fifth register operand are considered the first and second quarters for use in incrementing the first and second register operands. The method may further include unpacking each register operand of the third through fifth register operands from one or more continuous data streams at the memory interface, in which each register operand has a length shorter than a length of the memory interface.

In accordance with another aspect, a computer-readable storage medium includes instructions defining logic blocks of a microprocessor, the instructions being configured for use by an electronic design application executed by a computer to design the microprocessor. The logic blocks are configured to implement a method of implementing a finite impulse response (FIR) filter operation in the microprocessor. The method includes accessing first through fifth register operands from a plurality of operand registers, the first and second register operands being both read and written in the FIR filter operation, and the third through fifth register operands being only read in the FIR filter operation, incrementing the first register operand in a first multiply-accumulate (MAC) operation by a sum of a first product and a second product, the first and second products multiplying high and low halves of the third register operand, respectively, with either high and low halves of the fifth register operand or first and second quarters of the fifth register operand, respectively, and incrementing the second register operand in a second multiply-accumulate (MAC) operation by a sum of a third product and a fourth product, the third and fourth products multiplying a low half of the third register operand and the high half of the fourth register operand, respectively, with either the high and low halves of the fifth register operand or the first and second quarters of the fifth register operand, respectively.

In connection with the computer-readable storage medium, in some embodiments, the third and the fourth register operands may correspond with respective audio data elements of a set of audio data elements for the FIR filter operation. The fifth register operand may correspond with a set of filter coefficients for the FIR filter operation. The logic blocks may be configured for at least two-way SIMD operations such that the FIR filter operation is configured to implement a quadruple or higher MAC operation. Each half of the third and fourth register operands may be a 32-bit data value and each quarter of the fifth register operand may be a 16-bit data value. Each half of the third and fourth register operands may be a 24-bit data value and each half of the fifth register operand is a 24-bit data value. The method may further include loading a set of audio data elements into multiple registers of the plurality of operand registers in a first element order, and loading a set of filter coefficient elements in a second element order in a further register of the plurality of operand registers, the second element order being reversed relative to the first element order. The method may further include toggling which quarters of the fifth register operand are considered the first and second quarters for use in incrementing the first and second register operands. The method may further include unpacking each register operand of the third through fifth register operands from one or more continuous data streams at the memory interface, in which each register operand has a length shorter than a length of the memory interface.

In accordance with another aspect, a microprocessor includes a memory interface to store data to a memory, respectively, a plurality of registers, each register being configured to hold a respective data value for a corresponding data element of a set of data elements, and control logic configured to implement a store instruction to store the set of data elements via the memory interface. The store instruction is configured to add a rounding constant to each data value, select a subset of bits from each register, the subset corresponding with a rounded representation of the respective data value after addition of the rounding constant, determine whether an overflow condition is present for each data value after selecting the subset of bits, set the rounded representation of the respective data value to either a maximum value or a minimum value if the overflow condition is high positive or low negative, respectively, and write each rounded representation into a respective allocation of the memory interface for storage of the set of data elements collectively in consecutive positions in the memory.

In some embodiments, implementation of the store instruction may further include using a sign-extended guard bit with the rounded representation to check for overflow. Implementation of the store instruction may further include, before selecting the subset, rounding away a bottom number of bits of each data value. Writing each selected subset may include implementation of a packed store instruction to write each selected subset into the memory interface without space between consecutive selected subsets and without assigning one or more guard bits, the memory interface having a length that does not correspond to a multiple of a length of each selected subset. Each register may have a length of 64 bits. The memory interface may have a length of 64 bits. Each rounded representation may have a length of 32 bits, such that the set of data elements includes two data elements stored as the collective unit. Implementation of the store instruction may further include, before selecting the subset, saturation of a top number of bits of each data value.

In accordance with another aspect, a method of storing, to a memory, data values for a set of data elements in a plurality of registers of a microprocessor includes adding a rounding constant to each data value, selecting a subset of bits from each register, the subset corresponding with a rounded representation of the respective data value after addition of the rounding constant, determining whether an overflow condition is present for each data value after selecting the subset of bits, setting the rounded representation of the respective data value to either a maximum value or a minimum value, and writing each rounded representation collectively to a memory interface of the microprocessor for storage of the set of data elements in consecutive positions in the memory.

In some embodiments, the method may further include using a sign-extended guard bit with the rounded representation to check for overflow. The method may further include, before selecting the subset, disregarding a bottom number of bits of each data value. Writing each selected subset may include packing each selected subset into the memory interface without space between consecutive selected subsets and without assigning one or more guard bits, the memory interface having a length that does not correspond to a multiple of a length of each selected subset. Each register may have a length of 64 bits, the memory interface may have a length of 64 bits, and each rounded representation may have a length of 32 bits, such that the set of data elements includes two data elements stored as the collective unit. The method may further include, before selecting the subset saturating a top number of bits of each data value.

In accordance with another aspect, a computer-readable storage medium includes instructions defining logic blocks of a microprocessor, the instructions being configured for use by an electronic design application executed by a computer to design the microprocessor. The logic blocks are configured to implement a method of storing, to a memory, data values for a set of data elements in a plurality of registers in the microprocessor. The method includes adding a rounding constant to each data value, selecting a subset of bits from each register, the subset corresponding with a rounded representation of the respective data value after addition of the rounding constant, determining whether an overflow condition is present for each data value after selecting the subset of bits, setting the rounded representation of the respective data value to either a maximum value or a minimum value if the overflow condition is high positive or low negative, respectively, and writing each rounded representation collectively to a memory interface of the microprocessor for storage of the set of data elements in consecutive positions in the memory.

In connection with the computer-readable storage medium, in some embodiments, the method may further include using a sign-extended guard bit with the rounded representation to check for overflow. The method may further include, before selecting the subset, disregarding a bottom number of bits of each data value. Writing each selected subset may include packing each selected subset into the memory interface without space between consecutive selected subsets and without assigning one or more guard bits, the memory interface having a length that does not correspond to a multiple of a length of each selected subset. Each register may have a length of 64 bits, the memory interface may have a length of 64 bits, and each rounded representation may have a length of 32 bits, such that the set of data elements includes two data elements stored as the collective unit. The method may further include, before selecting the subset saturating a top number of bits of each data value.

In accordance with another aspect, a microprocessor includes a memory interface to obtain data envelopes of a first length, a plurality of registers, a buffer, and control logic configured to implement a plurality of instructions including a first instruction configured to load an initial data envelope of a stream of data values into the buffer, each data value having a second length shorter than the first length, the stream of data values being disposed continuously across successive data envelopes obtained via the memory interface, a second instruction configured to merge current contents of the buffer and the memory interface such that each invocation of the second instruction loads a respective one of the stream of data values into a first register of the plurality of registers, and in which the second instruction is configured to move at least a remainder of the current contents of the memory interface into the buffer for use in a successive invocation of the second instruction, a third instruction configured to load a reversed representation of a set of data values obtained via the memory interface into a second register of the plurality of registers, the reversed representation reversing an order of elements in the set, and a fourth instruction configured to implement a finite impulse response (FIR) computation including a single-instruction, multiple data (SIMD) operation involving multiple data values of the stream of data values loaded via the second instruction and the reversed representation of the set of data values in the second register.

In some embodiments, the plurality of instructions may further include a fifth instruction configured to round and store multiple output data values of the FIR computation via the memory interface by adding a rounding constant to each output data value, selecting a subset of bits from a respective result register of the plurality of registers in which the respective output data value is held, and writing each selected subset into a respective allocation of the memory interface. The fifth instruction may be configured to pack each selected subset into the memory interface without space between consecutive selected subsets and without assigning one or more guard bits, the memory interface having a length that does not correspond to a multiple of a length of each selected subset. The data values in the stream of data values may be indicative of audio data values and the data values in the set of data values are indicative of FIR filter coefficients. Each register in the plurality of registers may have a length equal to the first length. The second instruction may be configured to unpack the set of data values from a continuous stream at the memory interface. The fourth instruction may be configured to implement multiple multiply-accumulate (MAC) operations involving the stream of data values and the reversed representation of the vector of data values. The plurality of instructions may further include a fifth instruction configured to round results of the multiple MAC operations and provide the rounded results in a composite data envelope of the first length to the memory interface for storage. The initial data envelope may include at least a first byte of the initial data value.

In accordance with another aspect, a method for implementing a finite impulse response (FIR) filter using a microprocessor having a memory interface to obtain data envelopes of a first length, a buffer, and a plurality of registers, includes loading an initial data envelope of a stream of data values into the buffer, each data value having a second length shorter than the first length, the stream of data values being disposed continuously across successive data envelopes obtained via the memory interface, merging current contents of the buffer and the memory interface such that a respective one of the data values is loaded into a first register of the plurality of registers, moving at least a remainder of the current contents of the memory interface into the buffer for use in loading a successive data value in the stream of data values, loading reversed representations of a set of data values obtained via the memory interface into a second register of the plurality of registers, the reversed representation reversing an order of elements in the set, and implementing a plurality of multiply-accumulate (MAC) operations convolving respective data values of the stream of data values and the reversed representations of the set of data values.

In some embodiments, the method may further include rounding and storing multiple output data values of the plurality of MAC operations via the memory interface. Rounding and storing may includes adding a rounding constant to each output data value, selecting a subset of bits from a respective result register of the plurality of registers in which the respective output data value is held, and writing each selected subset into a respective allocation of the memory interface. Writing each selected subset may include packing each selected subset into the memory interface without space between consecutive selected subsets and without assigning one or more guard bits, the memory interface having a length that does not correspond to a multiple of a length of each selected subset. The data values in the stream of data values may be indicative of audio data values and the data values in the set of data values may be indicative of FIR filter coefficients. Each register in the plurality of registers may have a length equal to the first length. Loading the reversed representations may include unpacking the set of data values from a continuous stream at the memory interface. The method may further include rounding results of the plurality of MAC operations and providing the rounded results in a composite data envelope of the first length to the memory interface for storage. The initial data envelope may include at least a first byte of the initial data value.

In accordance with another aspect, a computer-readable storage medium includes instructions defining logic blocks of a microprocessor having a memory interface to obtain data envelopes of a first length, a buffer, and a plurality of registers. The instructions are configured for use by an electronic design application executed by a computer to design the microprocessor. The logic blocks are configured to implement a method including loading an initial data envelope of a stream of data values into the buffer, each data value having a second length shorter than the first length, the stream of data values being disposed continuously across successive data envelopes obtained via the memory interface, merging current contents of the buffer and the memory interface such that a respective one of the data values is loaded into a first register of the plurality of registers, moving at least a remainder of the current contents of the memory interface into the buffer for use in loading a successive data value in the stream of data values, loading reversed representations of a set of data values obtained via the memory interface into a second register of the plurality of registers, the reversed representation reversing an order of elements in the set, and implementing a plurality of multiply-accumulate (MAC) operations convolving respective data values of the stream of data values and the reversed representations of the set of data values, the plurality of MAC operations including a single-instruction, multiple data (SIMD) operation.

In connection with the computer-readable storage medium, in some embodiments, the method may further include rounding and storing multiple output data values of the plurality of MAC operations via the memory interface. Rounding and storing includes adding a rounding constant to each output data value, selecting a subset of bits from a respective result register of the plurality of registers in which the respective output data value is held, and writing each selected subset into a respective allocation of the memory interface. Writing each selected subset may include packing each selected subset into the memory interface without space between consecutive selected subsets and without assigning one or more guard bits, the memory interface having a length that does not correspond to a multiple of a length of each selected subset. The data values in the stream of data values may be indicative of audio data values and the data values in the set of data values are indicative of FIR filter coefficients. Each register in the plurality of registers may have a length equal to the first length. Loading the reversed representations may include unpacking the set of data values from a continuous stream at the memory interface. The method may further include rounding results of the plurality of MAC operations and providing the rounded results in a composite data envelope of the first length to the memory interface for storage. The initial data envelope may include at least a first byte of the initial data value.

This Summary is provided to introduce a selection of concepts in a simplified form that are further described below in the Detailed Description. This Summary is not intended to identify key features or essential features of the claimed subject matter, nor is this Summary intended to be used to limit the scope of the claimed subject matter.

DESCRIPTION OF THE DRAWING FIGURES

For a more complete understanding of the disclosure, reference should be made to the following detailed description and accompanying drawing figures, in which like reference numerals identify like elements in the figures.

Figure 1:
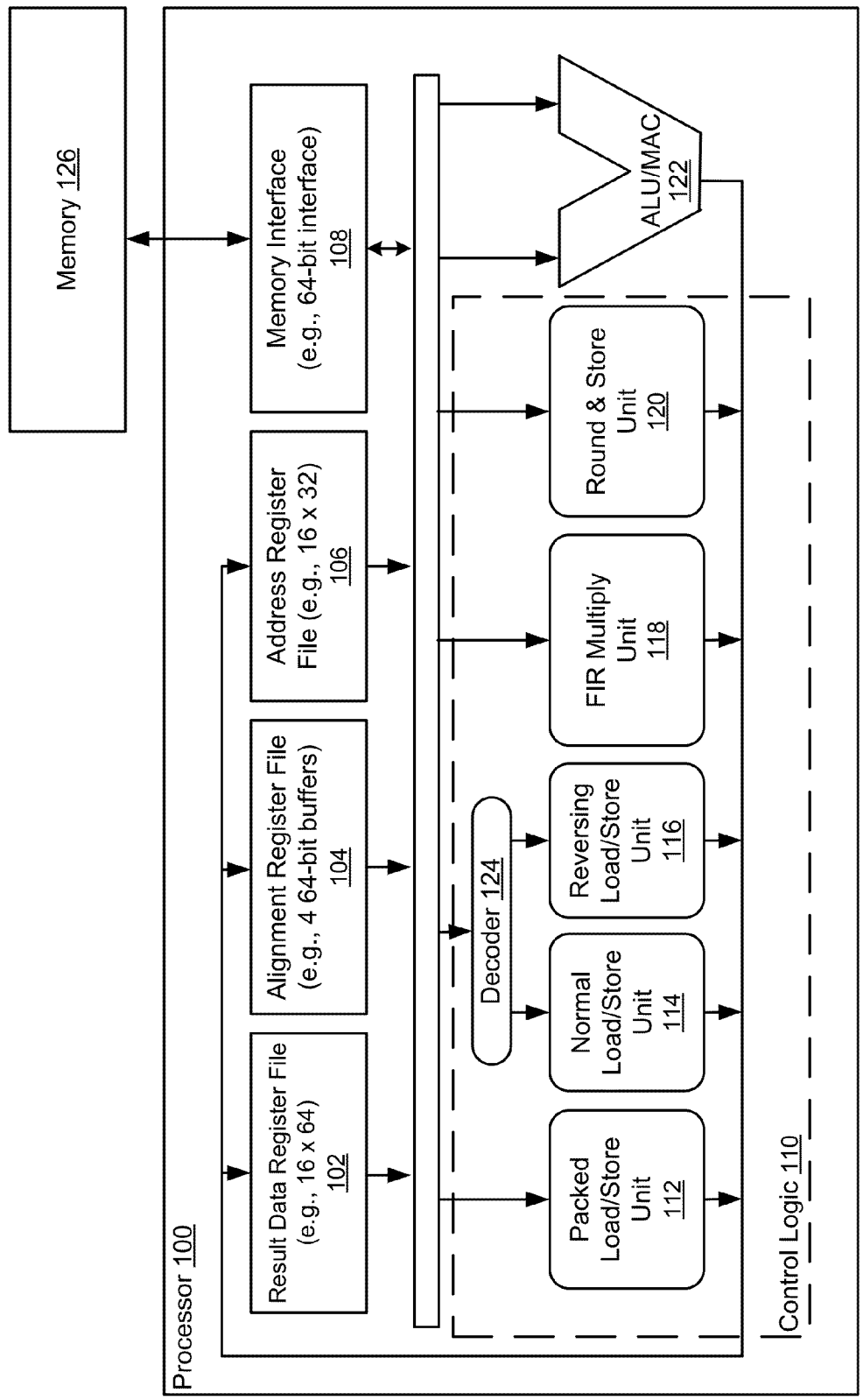
FIG. 1 is a block diagram of an exemplary microprocessor configured for efficient processing of audio data in accordance with one embodiment.

While the disclosed devices, methods, and computer program products are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION

Digital signal processors (DSPs) configured for low power, high performance implementation of voice and other audio applications are described. Methods of using such DSPs, as well as computer-readable storage media having instructions for designing or configuring such DSPs, are also described. The DSPs are configured for efficient execution of audio algorithms, such as finite impulse response (FIR) filter algorithms. Customization of the DSPs for efficiency in such audio algorithms allows the disclosed embodiments to provide improved performance without greatly increasing power consumption.

The disclosed embodiments may provide an efficient technique for storing and loading 24-bit data values via 32-bit data envelopes at a memory interface, pairs of 24-bit data values via 64-bit data envelopes, or other vector data elements in various single-instruction, multiple data (SIMD) architectures. Load and store operations are described in which data elements are unpacked (in a load operation) or packed (in a store operation) from/to a continuous data stream at a memory interface. The loading or storing is efficiently achieved despite a difference between the lengths of the data elements and the memory interface. The continuous nature of the data stream may refer to the manner in which elements in the data stream may be stored in consecutive memory addresses without gaps or wasted memory. Notwithstanding the advantages of avoiding wasted memory, the disclosed DSPs may include one or more registers or register files having a length unequal to the length of the audio data or other data elements. For example, the processor registers may be 32-bit registers despite the 24-bit length of the audio data, or 64-bit registers despite the 48 bits taken up by the pair of 24-bit data values. In some cases, the extra bits supported by the registers may be used as guard bits. The disclosed embodiments may also efficiently load and store data values having a length other than 24 bits in a packed format as described herein.

The disclosed embodiments may be configured to implement audio algorithms that filter audio data, such as a finite impulse response (FIR) filter. FIR filtering convolves a set of audio data with a set of filter coefficients. FIR filtering may be approximated with the mathematical formula $$y[i] = \sum_{j=0}^{M} c[j] * x[M + i - j]$$

where x represents the input audio data, y represents the output data, and c represents the coefficients.

The implementation of the FIR and other audio algorithms may be supported via techniques that load or store a reversed representation of a vector or data set. The data elements of the vector are loaded or stored in an element order reversed from the order in which the vector is read from a memory interface or register. The data results generated by the implementation of the FIR or other audio algorithms may be rounded in stored in a compound manner as described below.

Although described in connection with a number of embodiments using 24- and/or 32-bit data elements (or pairs or other SIMD arrangements of such data values), the disclosed embodiments are not limited to any data element or memory unit length or register size. The SIMD width of the disclosed embodiments may vary from the examples described herein. The storage of the data elements may vary in alternative or additional ways. For instance, the disclosed embodiments may be used in connection with either a little or big Endian data format or scheme.

FIG. 1 depicts an example of a digital signal processor (DSP) 100 or other microprocessor configured in accordance with one embodiment. The DSP 100 includes a number of storage units. The storage units may be configured as one or more register files, one or more individual registers, individual buffers, and/or other internal memory units. In this example, the DSP 100 includes a data register file 102, an alignment buffer file 104, and an address register file 106. Additional, alternative, or fewer storage units may be included. For example, one or more of the storage units may be integrated to any desired extent. One or more of the storage units may be incorporated into a processor core of the DSP 100 and/or an extension to a processor core.

One or more of the storage units may be configured for single-instruction, multiple data (SIMD) processing. In this example, the data register file 102 includes 16 64-bit registers, the alignment buffer file 104 includes four 64-bit register buffers, and the address register file includes 16 32-bit registers. The SIMD width and/or the bit length of the memory units may vary from the example shown. For example, the 64-bit length of the alignment buffer file 104 may split into four SIMD elements of 16-bit length in accordance with a four-way SIMD scheme. The architecture of the DSP 100 may vary in other ways, including, for instance, the replication of the depicted components to support multiple pipelines, such as configurations used in implementation of very long instruction word (VLIW) parallelism.

Data is written to the storage units via a memory interface 108. In this example, the memory interface 108 is configured to provide 64-bit data envelopes to the storage units. The DSP 100 may include any number of memory interfaces, the configuration of which may vary.

The DSP 100 includes control logic 110 configured to implement a plurality of instructions or instruction sets. In some embodiments, the control logic 110 is implemented via one or more logic circuits or other hardware configured in accordance with the instructions. For example, such circuitry or hardware may include a respective logic block configured in accordance with each instruction or instruction set. Such logic blocks may be designed via an automated design application responsive to a representation of the instructions or instruction sets set forth in a hardware description language (HDL). The instructions or instruction sets may thus define an instruction set architecture (ISA) for the DSP 100. The ISA may establish or define circuitry for a processor core of the DSP 100 and/or an extension to the processor core. The logic circuit(s) may thus vary accordingly. In this example, control logic 110 includes a packed load/store unit 112, a normal load/store unit 114, a reversing load/store unit 116, a finite impulse response (FIR) multiply unit 118, and a compound round and store unit 120. Each such unit may correspond with a respective logic block of the logic circuit(s) of the DSP 100. The DSP 100 also includes one or more functional units, such as arithmetic logic units 122, which may, in turn, include one or more multiply-accumulate (MAC) units or other accumulators or other arithmetic units. Additional, alternative, or fewer logic and/or functional units or blocks may be included within the control logic 110. For example, one or more of the MAC or other arithmetic units may be integrated within one of the other logic units, such as the FIR multiply unit 118.

The control logic 110 may include one or more other logic units or blocks configured in accordance with, or to implement, the instructions or instruction sets. For example, the control logic 110 may include one or more decoders or other control units to direct operations in response to an instruction. In this example, the control logic 110 includes a decoder 124 configured to determine whether the normal load/store unit 114 or the reversing load/store unit 116 is implemented or used during a particular processing routine or algorithm.

The memory interface 108 is configured to support communications with a memory 126. In some cases, the memory 126 is configured as random access memory (RAM). For example, the memory 126 may include dynamic RAM (DRAM) and/or static RAM (SRAM). Other types of memory or storage devices may be used, including various types of read-only memory (ROM). The memory 126 may provide any desired combination of volatile and non-volatile storage. Data is accessed from, or provided to, the memory 126 in accordance with memory address data provided via the address register file 106. The memory interface 108 is used to load or store data envelopes from or to the memory 126.

The memory interface 108 may be configured such that each data envelope has a length (e.g., 32 or 64 bits) that differs from the length of the data elements processed by the DSP 100. As described below, the length of the data elements may be shorter than the length of the data envelopes. For example, the data elements may have a length of 24 or 48 bits. The data elements may be scalar data elements or vector data elements. For example, a 48-bit vector data element may include two 24-bit scalar data elements. The configuration of the control logic 110 allows the length of the data envelope to not be an integer multiple of the length of the data element. The shorter data element notwithstanding, the registers of one or more of the above-described register files may have a length equal to the data envelope length. Registers having a longer length (e.g., 32 bits rather than 24 bits) may be useful to provide guard bits or sign-extended values. Alternatively, the registers of one or more of the register files have a length that corresponds with the length of the data elements.

The control logic 110 is configured to implement a plurality of instructions via, e.g., the above-referenced logic blocks or logic units. The instructions may be configured to implement a finite impulse response (FIR) filter operation or other filter operation. The data values loaded via the memory interface 108 may be audio data values and/or a set of filter coefficients (e.g., FIR filter coefficients).

In the embodiment of FIG. 1, the packed load/store unit 112 of the control logic 110 is configured to implement a priming instruction that primes the alignment register file 104 for a load operation that extracts data values from a packed succession or stream of data envelopes. The priming instruction is configured to load an initial data envelope of a stream of data values into one of the registers (or buffers) of the alignment register file 104. The stream of data values is disposed continuously across successive data envelopes obtained via the memory interface 108. The initial data envelope includes at least a first byte of the initial data value. Additional bytes of the initial data value may also be included in the initial data envelope depending on the extent to which the initial data envelope and the initial data value are aligned (or misaligned).

After the alignment register file 104 is primed for a load operation, the packed load/store unit 112 may implement a load instruction that merges current contents of the buffer in the alignment register file 104 and the memory interface 108. The merged results of each invocation of the load instruction are then deposited into a respective register of the result data register file 102. The load instruction is also configured to move at least a remainder of the current contents of the memory interface 108 into the buffer of the alignment register file 104 for use in a successive invocation of the load instruction. At least a remainder may correspond with all of the current contents of the memory interface 108. Thus, in some cases, the entire current contents of the memory interface 108 are moved into the buffer. Alternatively, at least a remainder may correspond with that portion(s) of the current contents not involved in the merge. In either case, the load instruction is configured to unpack the set of data values from a continuous stream at the memory interface 108. Further details regarding the unpacking of data values during a load operation, and packing of data values in a store operation, are set forth below in connection with FIGS. 3-5.

The normal and reversing load/store units 114, 116 of the control logic 110 are configured to control an element order of the data elements loaded via the memory interface 108. The decoder 124 may be used to direct whether the data elements are loaded in the normal (e.g., ascending) element order or a reversed (e.g., descending) element order. For instance, the decoder 124 may direct the reversing load/store unit 116 to load a reversed representation of a set of data values obtained via the memory interface 108 into a respective register of the result data register file 102. The reversed representation may present the set of data elements in a reversed (e.g., descending) order for subsequent use (e.g., in a SIMD operation). The normal and reversing load/store units 114, 116 may be implemented in connection with the packed load/store unit 112 to, for instance, reverse the element order of a set of data elements being packed or unpacked. Further details regarding these logic blocks are set forth below in connection with FIGS. 6 and 7.

The FIR multiply unit 118 of the control logic 110 is configured to implement one or more finite impulse response (FIR) computations. The data values (and element order thereof) may be provided via the above-described logic blocks in a manner that allows the FIR multiply unit 118 to implement one or more SIMD operations. For example, one set of data values (e.g., audio data elements) of the stream of data values unpacked and loaded via the load operation may be multiplied by a reversed representation of another set of data values (e.g., filter coefficients). The FIR multiply unit 118 may be configured to implement multiple multiply-accumulate (MAC) operations involving such streams or sets of data values (normal and reversed), as described below in connection with FIGS. 8-10.

In the embodiment of FIG. 1, the compound round and store unit 120 may be configured to implement an instruction that rounds and stores multiple output data values of the FIR computations via the memory interface 108. The output data values may correspond with the results of the multiple MAC operations. The compound round and store unit 120 may add a rounding constant to each output data value, select a subset of bits from a respective result register of the result data register file 102 in which the respective output data value is held, and write each selected subset into a respective allocation of the memory interface 108. A composite data envelope may be presented to the memory interface 108 after the rounding. In some cases, the storage of the selected subsets includes packing each selected subset into the memory interface 108 without space between consecutive selected subsets (as described below in connection with FIG. 5).

Figure 2:
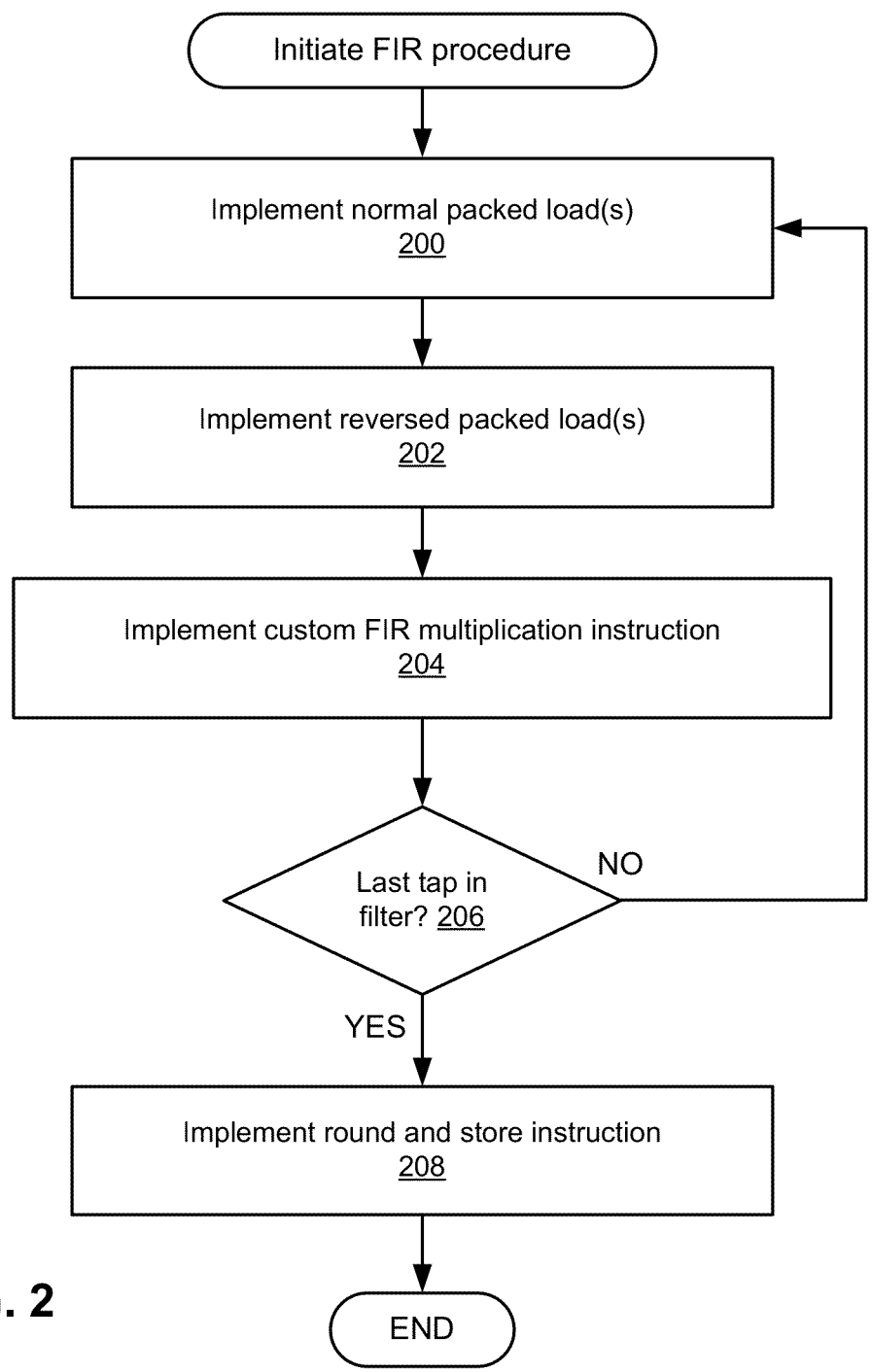
FIG. 2 is a flow diagram of an exemplary method of implementing a finite impulse response (FIR) filter procedure in accordance with one embodiment.

FIG. 2 depicts a flow diagram of a method that may be implemented by the DSP 100 of FIG. 1. In this example, the method is directed to implementing a finite impulse response (FIR) filter. Data envelopes may be obtained or accessed via a data stream at the memory interface 108 (FIG. 1) to deposit data elements in one or more registers of the DSP 100 as described above. In this FIR filter example, the data elements include audio data values and a set of data values indicative of FIR filter coefficients.

The FIR filter procedure may begin in an act 200 in which one or more normal packed load operations are implemented.

A normal packed load operation may be directed to loading the audio data to be filtered or the filter coefficients. In this example, the act 200 includes loading an initial data envelope of a stream of data values into a buffer (e.g., an alignment buffer of an alignment register file). Each data value is shorter than the length of the data envelope. The initial data envelope includes one or more bytes of an initial data value to be loaded. The stream of data values is disposed continuously across successive data envelopes obtained via the memory interface. The act 200 further includes unpacking or extracting a set of data values from the continuous stream at the memory interface. As described below, the unpacking may include merging current contents of the buffer and the memory interface such that a respective one of the data values is loaded into a register of a register file into which the data values are being loaded. At least a remainder of the current contents of the memory interface (e.g., all of the current contents) is then moved into the buffer for use in loading a successive data value in the stream of data values.

In act 202, one or more reversed representations of data values are loaded. The data values may be part of a set of data values obtained via the memory interface. For example, the set of data values may correspond with audio data or filter coefficients. The reversed representations may be loaded into one or more registers of a register file. Each reversed representation reverses or flips the order of elements in the set, as describe further below.

Once the data values are loaded in either normal or reversed order, a customized FIR multiplication instruction is then implemented in act 204. The instruction may be configured to implement a number of multiply-accumulate (MAC) operations that convolve respective data values, such as the audio data values of the stream of data values and the reversed representations of the set of filter coefficients.

A decision block 206 determines whether the convolution operation has reached the last or final tap for the FIR filter. If the order of the filter has additional convolution terms to be computed, control returns to the act 200 for further data loading. If the last tap has been reached, control passes to act 208 in which the results of the MAC operations are rounded and provided in one or more composite data envelopes to the memory interface for storage. The rounding and storing of the output data values may include, as described further below, adding a rounding constant to each output data value, selecting a subset of bits from a respective result register in which the respective output data value is held, and writing each selected subset into a respective allocation of the memory interface. The selected subsets may be packed into a continuous stream to avoid wasting space between consecutive selected subsets.

The disclosed microprocessors may be designed via a design application (e.g., an automated design tool) configured in accordance with one or more instruction sets. The instruction set(s) may form an instruction set architecture for the microprocessor. The design application may be executed by a computing system to use the instruction set(s) to design a microprocessor having the registers, memory interface, logic blocks, and other components to implement the methods described herein. The instruction set(s) may be set forth as a computer program or software product in which the instructions are stored on one or more computer-readable storage media. As described herein, the instructions may thus define logic blocks of the microprocessors that are configured to perform the disclosed methods and operations.

The computing system used to execute the instruction set(s) defining the disclosed microprocessors may include a processor, such as a central processing unit (CPU). The processor may be a component in a variety of systems. For example, the processor may be part of a standard personal computer or a workstation. The computer system may include one or more memories or storage devices that communicate with the processor via a bus. The memories may include a main memory, a static memory, or a dynamic memory. The memories may include, but may not be limited to computer readable storage media such as various types of volatile and non-volatile storage media, including but not limited to random access memory, read-only memory, programmable read-only memory, electrically programmable read-only memory, electrically erasable read-only memory, flash memory, magnetic disk, optical media and the like. In one case, the memories may include a cache or random access memory for the processor. Alternatively or in addition, the memories may be separate from the processor 402, such as a cache memory of a processor, the system memory, or other memory. The memories may include an external storage device or database for storing data. The memories may be operable to store instructions executable by the processor. The computing system may further include one or more input/output devices, such as a display and/or a speaker.

Examples of the instructions used to define the disclosed microprocessors and implement the disclosed data processing operations and methods are provided below. A number of exemplary DSP processor instructions are set forth in the Tensilica Instruction Extension (TIE) language from Tensilica, Inc. of Santa Clara, Calif. The TIE language and extensions thereof may be used to specify an instruction set architecture (ISA) of the disclosed DSPs. Further details regarding the TIE language and TIE language extensions are set forth in U.S. Pat. No. 6,477,683 ("Automated Processor Generation System for Designing a Configurable Processor and Method for the Same"), U.S. Pat. No. 6,477,697 ("Adding Complex Instruction Extensions Defined in a Standardized Language to a Microprocessor Design to Produce a Configurable Definition of a Target Instruction Set, and HDL Description of Circuitry Necessary to Implement the Instruction Set, and Development and Verification Tools for the Instruction Set"), U.S. patent application Ser. No. 10/146,655, entitled "Method and Apparatus for Adding Advanced Instructions in an Extensible Processor Architecture"), and U.S. patent application Ser. No. 10/922,125 ("System and Method For Automatic Conversion of a Partially-Explicit Instruction Set to an Explicit Instruction Set), the entire disclosures of which are hereby incorporated by reference.

The instructions on the disclosed computer-readable storage media may be set forth in a hardware description language (HDL) or otherwise specify an instruction set architecture of the disclosed DSPs. Although described below in connection with the TIE language, the disclosed embodiments are not limited to any particular HDL or other instruction format or type (e.g., Verilog, VHDL, etc.). The disclosed embodiments are well suited for use with any type of HDL, and need not be used with languages directed to defining additions to a processor core.

Constructs set forth in the TIE or other HDL language may specify the characteristics of a respective operation implemented by the DSP. For example, the following instructions specify how to load data from a memory into a 24-bit register.

```
regfile AE_DR 24 16 aed
operation AE_L24.I {out AE_DR v, in AR *a, in ae_immls32 i32} {out
VAddr, in MemDataIn32} {
    wire [32:0] vaddr;
    wire [31:0] t;
```

-continued

```
    assign vaddr = ({1'b0, a}) + ({i32[31], i32});
    assign VAddr = vaddr[31:0];
    assign v = MemDataIn32[23:0];
}
```

The regfile statement in the TIE language defines a register of the processor. In this example, the register file has 16 entries, each of which has a 24-bit length. The operation statement defines a new instruction. In this example, the AE_L24.I instruction loads data from a memory (e.g., a memory external to the processor). The data from the memory comes back through the MemDataIn32 memory interface. The memory on the DSP supports powers-of-two in size. Thus, in this example, the memory interface presents 32-bit data envelopes from the memory to load the data. Because the register has a length of 24 bits, the statement "assign v=MemDataIn32[23:0]", puts the lowest 24 bits from the memory into the register and discards the upper eight bits.

A 24-bit store operation may be specified as follows:

```
operation AE_S24.I {in AE_DR v, in AR *a, in ae_immls32 i32} {out
VAddr, out MemDataOut32} {
    wire [32:0] vaddr;
    assign vaddr = ({1'b0, a}) + ({i32[31], i32});
    assign VAddr = vaddr[31:0]
    assign MemDataOut32 = {8'b0, v[23:0]};
}
```

Memory is stored by assigning to a 32-bit memory interface MemDataOut32. Because the register has a 24-bit length but the interface has a 32-bit length, an extra eight bits of 0 are assigned to the upper bits of the 32-bit word in memory.

The load and store instructions as shown above waste memory. While only 24-bits are needed, 32-bits are stored to and loaded from memory. A more efficient mechanism for packing and unpacking data values is defined below.

Unpacking Loads and Packing Stores.

Figure 3:
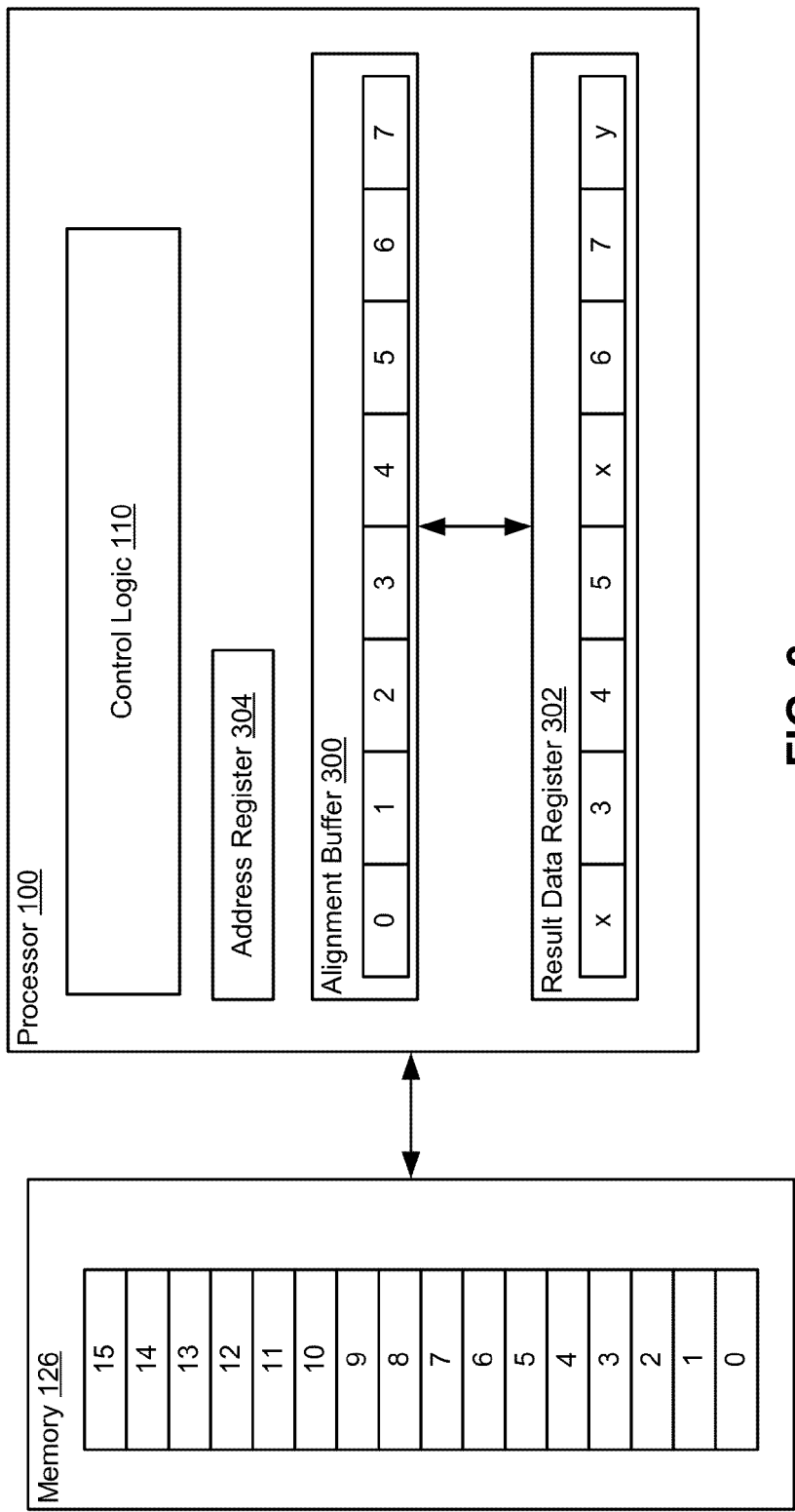
FIG. 3 is a block diagram of an exemplary microprocessor configured to load and store audio data via a memory in accordance with one embodiment.

FIG. 3 depicts the DSP 100 in greater detail to depict the manner in which data elements may be packed or unpacked to or from a number of data envelopes from a continuous succession of memory addresses in the memory 126. The data envelopes may support SIMD processing, such as two-way SIMD processing. The SIMD width may vary. In this example, data elements available via the memory interface 108 (FIG. 1) are vector data elements including multiple scalar data elements or data values, each data value having a length of 24 bits. The data envelopes provided via the memory interface have a length of 64 bits to support a pair of such 24-bit data values. Other lengths may be supported in connection with, for instance, a non-SIMD architecture or other SIMD architectures. For example, in a non-SIMD architecture, the data envelopes may have a length of 64 bits, through which 48-bit data values may be packed. Each data element may thus be a scalar data element or a vector data element including one or more scalar data elements.

The control logic 110 is configured to direct the packing or unpacking in connection with an alignment buffer 300 (or register of the alignment register file 104 of FIG. 1) and a result data register 302 (e.g., one of the registers of the result data register file 102 of FIG. 1). In this example, the result data register 302 has a length (e.g., 64 bits) that corresponds with the length of each data envelope. The extra bits may provide space for one or more guard bits for each one of the pair of 24-bit data values. The extra bits may alternatively or additionally be set to sign-extended values. Alternatively, the result data register 302 has a length that corresponds with the length of each data value or data element (e.g., 24 bits). In this example, an "x" shown in the result data register 302 may correspond with a sign extension or guard bit, or a "0" in some cases. A "y" shown in the result data register 302 may be indicative of data not yet loaded.

The alignment buffer 300 is shown after implementation of an initialization instruction configured to initialize the alignment buffer 300 in a load operation in which an initial envelope is loaded into the alignment buffer 300. A memory location of the initial envelope may be provided via an address register 304 (e.g., a register of the address register file 106 of FIG. 1). The initial envelope includes a first byte of a first data element (byte 2 in this example) of the stream of data elements (bytes 0-7 in this example). During a store operation in which data elements are packed, the initialization instruction is configured to initialize the alignment buffer 300 by clearing the alignment buffer 300, as described below in connection with FIG. 5.

During a load operation, the control logic 110 may then implement a data merge instruction configured to extract or unpack a respective data element from or into the stream of data elements. The current contents of the alignment buffer 300 (i.e., bytes 2 and 3) are merged with the current contents of the memory interface, at which the next data envelope (i.e., bytes 4-7) is available, into the result data register 302. The result data register file 302 is depicted in FIG. 3 before the last byte (byte 4) of the 24-bit data value is provided via the memory interface. The data merge instruction also moves at least the remainder (e.g., all) of the current contents of the memory interface into the alignment buffer 300 for use in a successive invocation of the load operation or the data merge instruction.

The data merge instruction may be further configured to increment the address register 304 in accordance with the length of the data element, e.g., the number of bytes loaded into the result data register 302.

During a store operation, the data merge instruction is configured to merge the current contents of the alignment buffer 300 and the result data register 302 into the memory interface, and move at least the remainder of the current contents of the result data register 302 into the alignment buffer 300 for use in a successive invocation of the data merge instruction.

The control logic 110 may be further configured to implement a flush instruction at the end of a store operation. The flush instruction is configured to flush any data remaining in the alignment buffer 300 upon reaching the end of the stream of data elements to be stored.

With the unequal lengths of the data elements and the data envelopes at the memory interface, the contents of the alignment buffer 300 or the result data register 302 will be periodically aligned with the data element to be loaded or stored. The data merge instruction may be further configured to determine whether, in a load operation, the alignment buffer 300 includes an entire representation of the data element such that no further data is required from the memory interface. The data merge instruction may be further configured to determine, in a store operation, whether any further data is moved to the memory interface. Thus, on the store side, while the contents of the result data register 302 are used during each invocation of the data merge instruction, periodically, e.g., in one of every four stores, the entire register contents are copied to the alignment buffer 300, and no data is stored to memory.

The disclosed embodiments may be configured to load or store N sequential 24-bit values to/from memory by invoking N+1 instructions. No memory is wasted. N 24-bit data items are stored in N*24-bits.

In some embodiments, the alignment buffer 300 may be defined as part of an alignment register file. An exemplary TIE instruction may define the alignment register file, AE_VALIGN, as follows:

regfile AE_VALIGN 64 4 u.

The alignment register file may be used to buffer the extra data when, for instance, 64-bit data is brought back from memory even though a vector data element (including, e.g., a pair of scalar data elements) only has, e.g., a 48-bit length (or, e.g., when a scalar data element has only a 48-bit length). The logic circuitry resulting from such TIE instruction language may vary.

The result data register 304 into which the data values are loaded may be part of a register file. An exemplary TIE instruction may define a register file with 48-bit registers as follows:

regfile AE_DR 48 16 aed.

In other cases, the registers in the register file may have a 64-bit length. The extra bits may be used as guard bits. The logic circuitry resulting from such TIE instruction language may vary.

Figure 4:
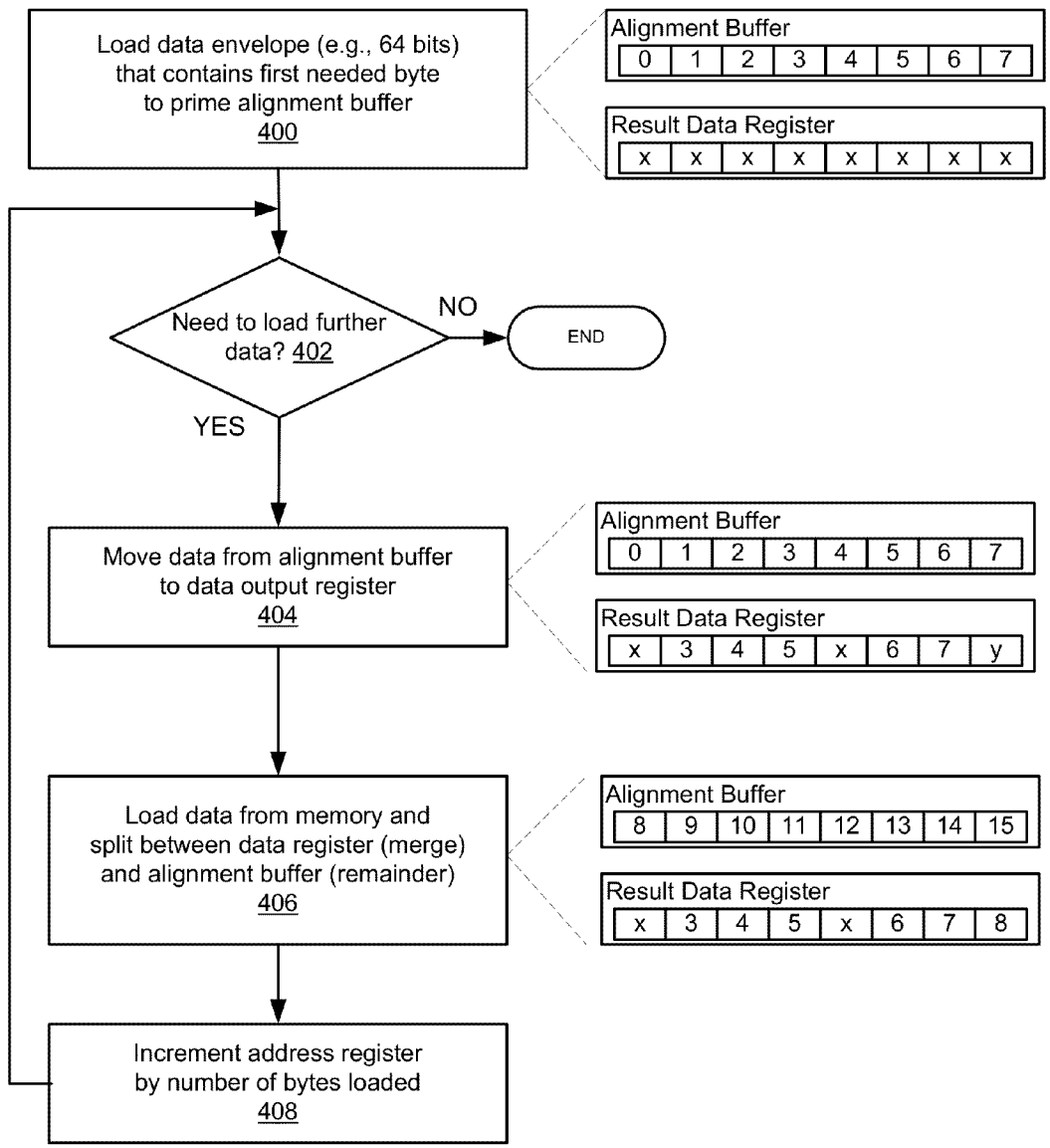
FIG. 4 is a flow diagram of an exemplary method of loading audio data from a memory in accordance with one embodiment.

An example of a priming or initialization instruction to load a stream of N, 48-bit data elements is now described in connection with FIG. 4. A TIE example of a priming instruction, AE_LA64.PP, is set forth below. Each data element may be a vector data element (e.g., including a pair of 24-bit scalar data elements) or a 48-bit scalar data element. The priming instruction is invoked in act 400 to load a 64-bit data envelope {0, 1, 2, 3, 4, 5, 6, 7} into an alignment register. Because the load instruction loads 64-bits (or 8-bytes) on an aligned address (an address that is a multiple of eight bytes), but the first 48-bit data element in the stream may or may not be aligned to the 64-bit boundaries, the priming instruction loads the surrounding 64-bit envelope that contains the first needed byte. Depending on the alignment of the needed data, the priming instruction might load one, two, or up to all six needed bytes. Again depending on the alignment, the instruction might load extra, useless, bytes from before the stream or extra bytes from the second element of the stream.

One example of a priming instruction is as follows:

```
operation AE_LA64.PP {out AE_VALIGN uu, in AR *a} {out VAddr, in MemDataIn64} {
    assign VAddr = {a[31:3], 3'b0};
    assign uu = MemDataIn64
}
```

After invoking the AE_LA64.PP priming instruction, a decision block 402 determines whether further data values are to be loaded. When further data values are to be loaded, control passes to acts 404, 406, and 408 in which the next data value is loaded by invoking a load (or data merge) instruction. One example of a load instruction is the AE_LA24X2.IP instruction set forth below. The load instruction is invoked once for each data element in the stream. In SIMD embodiments, the load instruction is invoked once for each vector data element (e.g., each pair of scalar data elements). In non-SIMD embodiments, the load instruction is invoked once for each scalar data element. For each invocation, the desired data (e.g., pair of data values) might be completely in the alignment register or partially in the alignment register and partially in the next 64-bit address in memory. The AE_LA24X2.IP instruction therefore loads the next 64-bit data envelope, if needed, from memory. The loading of the next 64 bits in the act 406 may not be implemented if the entire data value is present in the alignment buffer 300 (which occurs once out of every four invocations in a 48-bit packed data/64-bit envelope embodiment).

Each invocation of the instruction merges the needed data from memory and the alignment register and returns the merged data set {x, 3, 4, 5, x, 6, 7, 8} to the result data register 302 (e.g., the output AE_DR register). The instruction puts the remaining data {8, 9, 10, 11, 12, 13, 14, 15} from memory into the alignment buffer 300 so that such data may be used in the next invocation of the instruction. The address loaded from memory is taken from the contents of the address register 304 (e.g., the general purpose address register, a, defined in the example below). The address register 304 is also incremented in the act 408 by six bytes in order to have the correct value for loading the next pair of data elements (or other vector or scalar data element) of the stream.

One example of a load instruction is as follows:

```
operation AE_LA24X2.IP {out AE_DR av, inout AE_VALIGN uu,
inout AR *a} {out LoadByteDisable, out VAddr, in MemDataIn64} {
    wire [31:0] vaddr_ip;
    wire [31:0] vaddr;
    wire [31:0] update_bytes;
    wire [32:0] sign_update_bytes;
    wire [32:0] new_vaddr;
    wire [2:0] base_addr;
    wire [0:0] is_aligned;
    wire [0:0] kill_load;
    wire [63:0] load_data;
    wire [2:0] shift_value;
    wire [127:0] concat_data;
    wire [127:0] shift_data;
    wire [63:0] data;
    wire [31:0] t0;
    wire [31:0] t1;
    assign vaddr_ip = a + 32'h5;
    assign vaddr = vaddr_ip;
    assign VAddr = {vaddr[31:3], 3'b0};
    assign update_bytes = 32'h6;
    assign sign_update_bytes = {update_bytes[31], update_bytes};
    assign new_vaddr = ({1'b0, a}) + sign_update_bytes;
    assign a = new_vaddr[31:0];
    assign base_addr = a[2:0];
    assign is_aligned = ~|base_addr[2:0];
    assign kill_load = (~is_aligned) & (a[3] == vaddr_ip[3]);
    assign load_data = MemDataIn64;
    assign LoadByteDisable = {8'b0, {8{kill_load}}};
    assign shift_value = base_addr[2:0];
    assign concat_data = kill_load ? ({64'b0, uu}) : (is_aligned ?
({64'b0, load_data}) : ({load_data, uu}));
    assign shift_data = concat_data >> ({shift_value, 3'b0});
    assign data = shift_data[63:0];
    assign uu = load_data;
    assign uu_kill = kill_load;
    assign t0 = {{8{data[23]}}, data[23:0]};
    assign t1 = {{8{data[47]}}, data[47:24]};
    assign av = {t0, t1};
}
```

Figure 5:
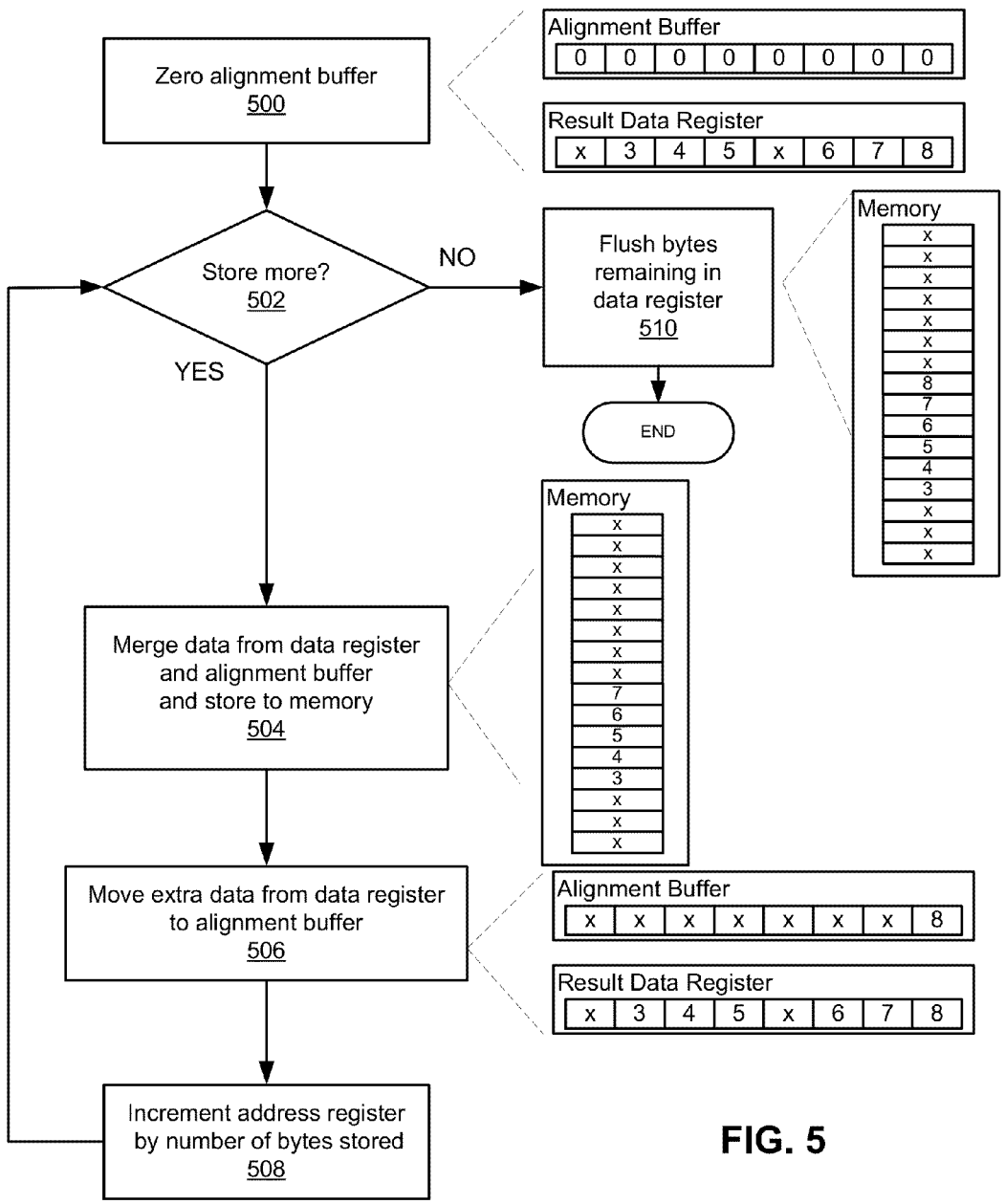
FIG. 5 is a flow diagram of an exemplary method of storing audio data to a memory in accordance with one embodiment.

FIG. 5 depicts an example of a packed store operation. An initialization instruction, e.g., AE_ZALIGN64, is first invoked in an act 500 to clear the alignment buffer 300, thereby clarifying that the alignment buffer 300 contains no useful data {0, 0, 0, 0, 0, 0, 0, 0}. As further data is to be stored, a decision block 502 passes control to acts 504, 506, and 508, which are implemented during an invocation of a store instruction. The store instruction may be invoked for each pair of data elements (or other vector or scalar data element) to be stored. An example of a store instruction, AE_SA24X2.IP, is set forth below. Each invocation, stores to memory (if needed) a combination of data already in the alignment register 300 together with new data coming from the result data register 302. In the example of FIG. 5, the alignment register contains no useful bytes, and the result data register provides the bytes {3, 4, 5, 6, 7}. Analogously to the load operation, the address register 304 is also incremented in the act 508 by, e.g., six bytes. The remaining, yet-to-be-stored data in the result data register, e.g. 8, 302, if any, is placed or deposited in the alignment register 300.

At the end of the data stream, the decision block 502 passes control to a block 510 in which a flush instruction is invoked. An example of a flush instruction, AE_SA64OS.FP, is set forth below. The flush instruction flushes the remaining bytes that have not yet been stored to memory. With the flush operation, N+2 instructions are needed to store N, 48-bit data elements (vector or scalar).

One example of a set of instructions to implement a packing store operation includes a buffer initialization instruction (AE_ZALIGN64), a store instruction (AE_SA24X2.IP), and a flush instruction (AE_SA64POS.FP), as follows:

```
operation AE_ZALIGN64 {out AE_VALIGN uu} { } {
    assign uu = 64'b0;
}
operation AE_SA24X2.IP {in AE_DR v, inout AE_VALIGN su, inout
AR *a} {out VAddr, out MemDataOut64, out StoreByteDisable} {
    wire [63:0] data;
    wire [31:0] vaddr;
    wire [31:0] update_bytes;
    wire [32:0] sign_update_bytes;
    wire [32:0] new_vaddr;
    wire [2:0] base_addr;
    wire [2:0] next_addr;
    wire [23:0] t0;
    wire [23:0] t1;
    wire [0:0] kill_store;
    wire [0:0] use_next_su;
    wire [0:0] single_byte;
    wire [1:0] multi_bytes;
    wire [2:0] su_index;
    wire [0:0] su_has_data;
    wire [2:0] disable_shift_amt;
    wire [7:0] disable_tmp;
    wire [7:0] disable;
    wire [2:0] new_su_index_tmp;
    wire [2:0] shift_amt;
    wire [63:0] input_data;
    wire [127:0] concat_data;
    wire [63:0] next_su_tmp;
    wire [63:0] store_data_tmp;
    wire [7:0] data_mask_byte;
    wire [63:0] data_mask_tmp;
    wire [63:0] data_mask;
    wire [63:0] store_data;
    wire [63:0] pos_su_index_mask;
    wire [63:0] su_index_mask;
    wire [2:0] new_su_index;
    wire [63:0] su_index_data;
    wire [63:0] next_su_tmp2;
    wire [63:0] next_su;
    assign vaddr = a;
    assign VAddr = {vaddr[31:3], 3'b0};
    assign update_bytes = 32'h6;
    assign sign_update_bytes = {update_bytes[31], update_bytes};
    assign new_vaddr = ({1'b0, a}) + sign_update_bytes;
    assign a = new_vaddr[31:0];
    assign base_addr = a[2:0];
    assign next_addr = new_vaddr[2:0];
    assign t0 = v[23:0];
    assign t1 = v[55:32];
    assign data = {16'b0, {t0, t1}};
    assign kill_store = a[3] == new_vaddr[3];
    assign use_next_su = |next_addr;
    assign single_byte = 1'b1;
    assign multi_bytes = 2'b0;
    assign su_index = su[59:57];
```

-continued

```
    assign su_has_data = su[56];
    assign disable_shift_amt = su_has_data ? su_index : base_addr;
    assign disable_tmp = (8'b1 << disable_shift_amt) - 8'b1;
    assign disable = disable_tmp;
    assign new_su_index_tmp = su_has_data ? su_index : base_addr;
    assign shift_amt = base_addr;
    assign input_data = data;
    assign concat_data = ({64'b0, input_data}) << ({shift_amt,
3'b01});
    assign next_su_tmp = concat_data[127:64];
    assign store_data_tmp = concat_data[63:0];
    assign data_mask_byte = (8'b1 << base_addr) - 8'd1;
    assign data_mask_tmp = {{8{data_mask_byte[7]}},
{8{data_mask_byte[6]}}, {8{data_mask_byte[5]}}, {8{data_mask_byte
[4]}},
{8{data_mask_byte[3]}}, {8{data_mask_byte[2]}}, {8{data_mask byte
[1]}},
{8{data_mask_byte[0]}}};
    assign data_mask = ~data_mask_tmp;
    assign store_data = (store_data_tmp & data_mask) | (su &
(~data_mask));
    assign pos_su_index_mask = 64'h00FFFFFFFFFFFFFF;
    assign su_index_mask = pos_su_index_mask;
    assign new_su_index = kill_store ? new_su_index_tmp : 3'b0;
    assign su_index_data = {4'b0, new_su_index, single_byte,
multi_bytes, 54'h0};
    assign MemDataOut64 = store_data;
    assign StoreByteDisable = kill_store ? ({8'h0, 8'hFF}) : ({8'h0,
disable});
    assign next_su_tmp2 = kill_store ? store_data : next_su_tmp;
    assign next_su = use_next_su ? ((next_su_tmp2 & su_index_mask) |
su_index_data) : 64'b0;
    assign su = next_su;
  }
  operation AE_SA64POS.FP {inout AE_VALIGN su, in AR *a}
{out VAddr, out MemDataOut64, out StoreByteDisable} {
    wire [2:0] f_base_addr;
    wire [2:0] f_su_index;
    wire [0:0] f_retrieve_single_byte;
    wire [1:0] retrieve_multi_bytes;
    wire [0:0] su_has_data;
    wire [7:0] disable1;
    wire [7:0] disable2;
    wire [7:0] disable;
    wire [0:0] kill_store;
    assign VAddr = {a[31:3], 3'b0};
    assign f_base_addr = a[2:0];
    assign f_su_index = su[59:57];
    assign f_retrieve_single_byte = su[56];
    assign retrieve_multi_bytes = su[55:54];
    assign su_has_data = f_retrieve_single_byte ? 1'b1 :
(|retrieve_multi_bytes);
    assign disable1 = (8'b1 << f_su_index) - 8'b1;
    assign disable2 = (8'b1 << f_base_addr) - 8'b1;
    assign disable = disable1 | (~disable2);
    assign kill_store = ~su_has_data;
    assign StoreByteDisable = kill_store ? ({8'h0, 8'hFF}) : ({8'h0,
disable});
    assign MemDataOut64 = su;
    assign su = 64'b0;
  }
```

Alternatively or additionally, the load or store instructions may add extra guard bits in the register, not to be loaded or stored, but, for instance, to be used by intermediate computations. In such scenarios, the result data registers may be 64-bit registers, where 48-bits are loaded or stored from memory, and the extra bits are ignored on stores and set to sign-extended values on loads.

The foregoing instructions may be modified to define a register file with 24-bit or 32-bit registers. In such embodiments, 32-bit envelopes may be loaded via the memory interface 108.

The number of elements in the above-described SIMD register(s) may vary. Each register may be configured to have any number of extra guard bits or other bits that are not loaded or stored. The instructions described herein may also be applied to either data elements with only a single data value, or various vector data element arrangements (e.g., a pair of data values, four data values, as well as groupings involving non-powers of two, such as three, five, etc., data elements). The disclosed embodiments are well suited for use with any number of data elements in various SIMD architectures.

Reversed Load and Store Operations.

The use of SIMD or vector instructions may allow the above-described registers to be loaded with a set of consecutive data values for processor instructions to perform the same operation on each element within the vector register. For example, on a two-way SIMD machine, one load instruction may load a register with the values of C variable a[i] and a[i+1], each variable occupying half the register. A second load instruction may load a register with the values of b[i] and b[i+1]. On that same machine, a SIMD add instruction may add together the bottom halves of the two registers and the top halves so that the top half of the result register holds a[i]+b[i] and the bottom half holds a[i+1]+b[i+1].

Many computations in audio, such as the finite impulse response (FIR) filter computation, do not translate well to SIMD techniques in which the same operation is applied to sets of operands, each operand coming from the same part of the registers. For example, a two-way SIMD add operation adds together the bottom half of two registers and the top half of the same registers. Some computations, such as the FIR computation, apply an operator using the bottom n'th portion (e.g., the bottom half in a two-way SIMD architecture) of one register with the top n'th portion of another register.

The reversed load and store operations of the disclosed embodiments allow an FIR filter to be efficiently implemented using one or more SIMD operations. As described in one example below, the reversed load and store operations allow multiplication operations of the FIR computation to determine the product of the high half of each register with the bottom half of another register.

Figure 6:
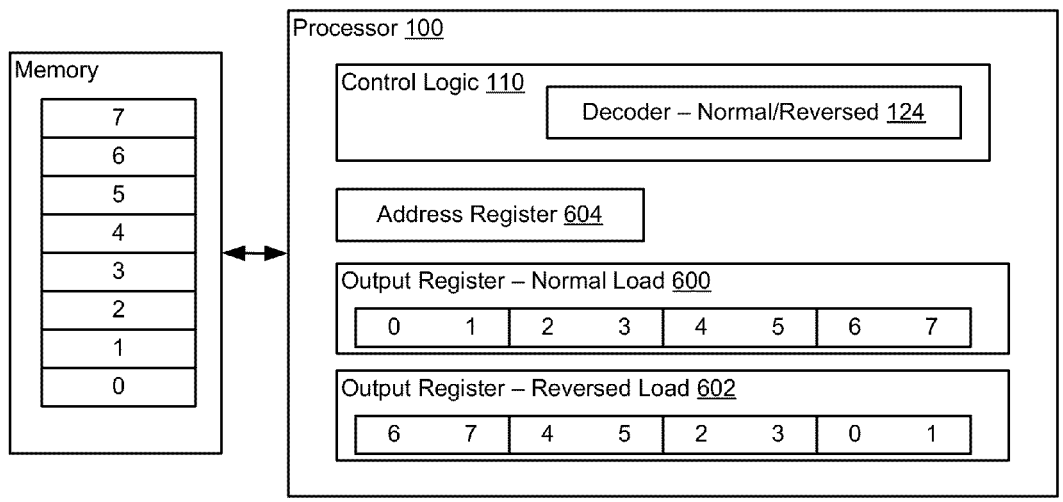
FIG. 6 is a block diagram of an exemplary microprocessor configured to load and store a data set in normal or reversed data element order in accordance with one embodiment.
Figure 7:
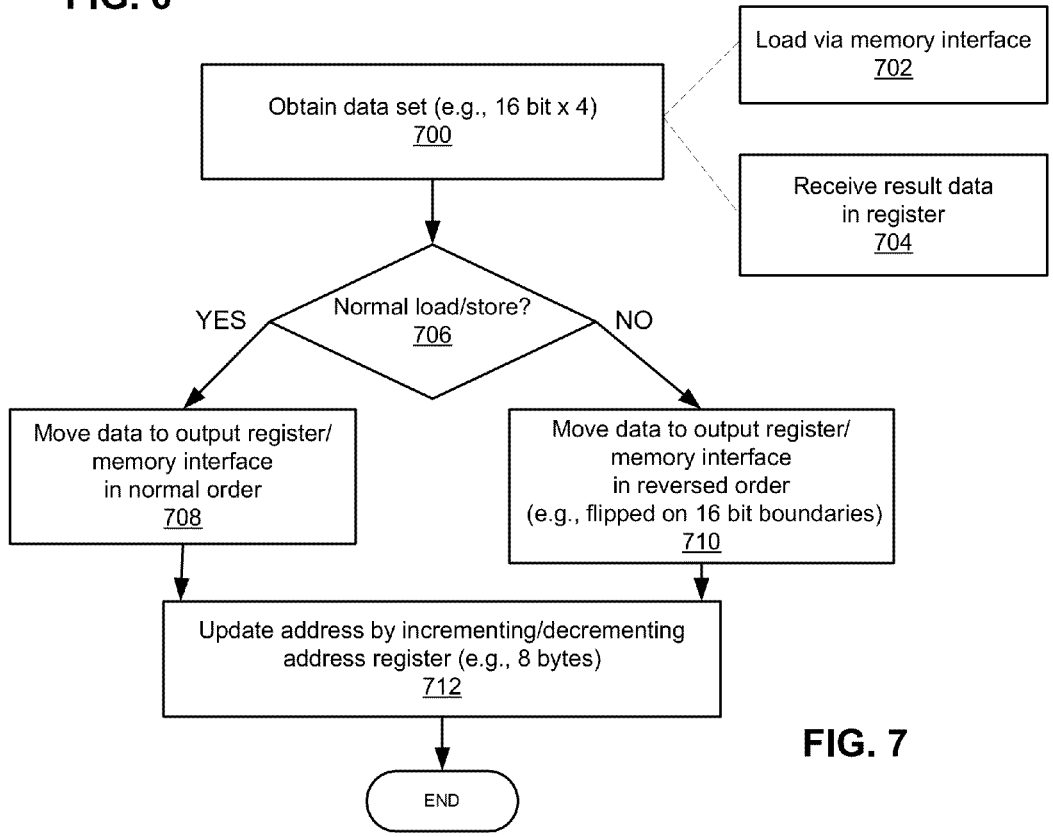
FIG. 7 is a flow diagram of an exemplary method of loading or storing a data set in normal or reversed data element order in accordance with one embodiment.

FIGS. 6 and 7 depict the DSP 100 in greater detail to show the operation of the control logic 110 during load and store operations that below flip (or reverse) the order of data elements of a vector when loading or storing the data from or to a memory via the memory interface 108 (FIG. 1). A reversed element order may provide a negative stride arrangement such that the location specified for a vector corresponds with the location of the last element in the vector. The control logic 110 is configured to implement a load instruction or a store instruction in either a normal (e.g., ascending) element order or a reversed (e.g., descending) element order. A normal element order with bytes {0, 1, 2, 3, 4, 5, 6, 7} is shown in an output or result data register 600, while a reversed element order is shown in an output or result data register 602. When each data element includes multiple bytes (e.g., two bytes), the data elements are flipped on multiple-byte boundaries as follows {6, 7, 4, 5, 2, 3, 0, 1}.

The load instruction or the store instruction being configured to obtain or access the vector of data elements in an act 700. In a load operation, the vector is obtained via the memory interface in an act 702. In a store operation, the vector is obtained in an act 704 via a register, such as one of the result data registers described above. A decision block 706 determines whether the load or store is to be implemented in either the normal element order or the reversed element order based on a control signal. In the example of FIG. 6, the control signal is provided to the decoder 124. The decoder 124 may be responsive to the control signal to direct the load or store operation to the normal load/store unit 114 (FIG. 1) in an act 708 or the reversing load/store unit 116 (FIG. 1) in an act 710.

The control logic 110 may be further configured to update in an act 712 an address register 604 during implementation of the load instruction or the store instruction. Alternatively, the reversing load and store instructions may be implemented in connection with non-updating loads and stores (e.g., those operations that do not update the address register).

The above-described load and store instructions may be defined for the DSP to allow the invocation of the instruction to determine the element order for the load or store (i.e., normal or reversed). A normal load/store operation may be implemented for one operand, and a reversing load or store may be implemented for another operand. The load and store instructions may accordingly avoid having to define instructions that explicitly rearrange the elements in a register, which may add overhead, thereby limiting performance, and increase power usage.

Two exemplary TIE instructions for four-way SIMD, 16-bit reversing updating loads and stores are set forth below. The instructions may be called by control logic to perform reversing loads and stores and also update the address pointer by 8-bytes. For example, a control signal may be provided to determine whether the reversing load or store instruction is invoked. Compared to normal updating SIMD loads and stores, the operations load/store the bottom 16-bits of the register with the top bits of memory, the next 16-bits from the bottom of the register with the next 16-bits at the top of memory, etc. Examples of normal and reversing load instructions in the TIE language are set forth below:

```
operation AE_L16X4.IP {out AE_DR v, inout AR *a, in
ae_immls64pos i64pos} {out VAddr, in MemDataIn64} {
    wire [32:0] vaddr;
    wire [32:0] new_vaddr;
    wire [15:0] t0;
    wire [15:0] t1;
    wire [15:0] t2;
    wire [15:0] t3;
    assign vaddr = {1'b0, a};
    assign VAddr = vaddr[31:0];
    assign new_vaddr = vaddr + ({i64pos[31], i64pos});
    assign a = new_vaddr[31:0];
    assign t0 = MemDataIn64[15:0];
    assign t1 = MemDataIn64[31:16];
    assign t2 = MemDataIn64[47:32];
    assign t3 = MemDataIn64[63:48];
    assign v = {t0, t1, t2, t3};
}
operation AE_S16X4.IP {in AE_DR v, inout AR *a, in ae_immls64pos
i64pos} {out VAddr, out MemDataOut64} {
    wire [32:0] vaddr;
    wire [32:0] new_vaddr;
    wire [15:0] t0;
    wire [15:0] t1;
    wire [15:0] t2;
    wire [15:0] t3;
    assign vaddr = {1'b0, a};
    assign VAddr = vaddr[31:0];
    assign new_vaddr = vaddr + ({i64pos[31], i64pos});
    assign a = new_vaddr[31:0];
    assign t0 = v[15:0];
    assign t1 = v[31:16];
    assign t2 = v[47:32];
    assign t3 = v[63:48];
    assign MemDataOut64 = {t0, t1, t2, t3};
}
```

The reversing load and store instructions may be applied during an unpacking load operation or a packing store operation in which the data elements are unpacked from, or packed into, a continuous stream of data elements. The vector data elements may thus have a length shorter than a length of the memory interface. For example, the reversing load or store instruction may be implemented in connection with a load or store operation (or sequence thereof) that unpacks or packs 24-bit data elements from or into 32-bit bundles, respectively.

The reversing load and store instructions may be configured to handle different SIMD widths and/or a different number of bits in each SIMD element. The reversing load and store instructions may be implemented in SIMD architectures other than those in which the SIMD width supports vectors including four data values, as in the examples above. The number of bits in each data value may alternatively or additionally vary.

The reversing load and store instructions may be implemented in an FIR filter operation as described below. The order of the audio data elements or the filter coefficients in the FIR filter operation may be reversed to implement the multiplication operations in the FIR filter operation efficiently (e.g., as a SIMD manner).

Customized FIR Multiplication Operations.

The disclosed embodiments may address one or more challenges arising from implementing an FIR filter. An FIR filter output data value $y[i]$ involves the computation of $c[j]*x[M+i-j]+c[j+1]*x[M+i-j-1]$, while the FIR filter output data value $y[i+1]$ involves the computation of $c[j]*x[M+i-j+1]+c[j+1]*x[M+i-j]$. The same filter coefficient, $c[j]$, is multiplied by both of the audio data elements, $x[M+i-j]$ and $x[M+i-j+1]$. The same filter coefficient $c[j+1]$ is multiplied against both $x[M+i-j-1]$ and $x[M+i-j]$. These multiplication operations do not fit the typical SIMD multiplication paradigm. In addition, three different audio data elements are needed, $x[M+i-j]$, $x[M+i-j+1]$, and $x[M+i-j-1]$, but only two elements are stored in a 2-way SIMD register.

Figure 8:
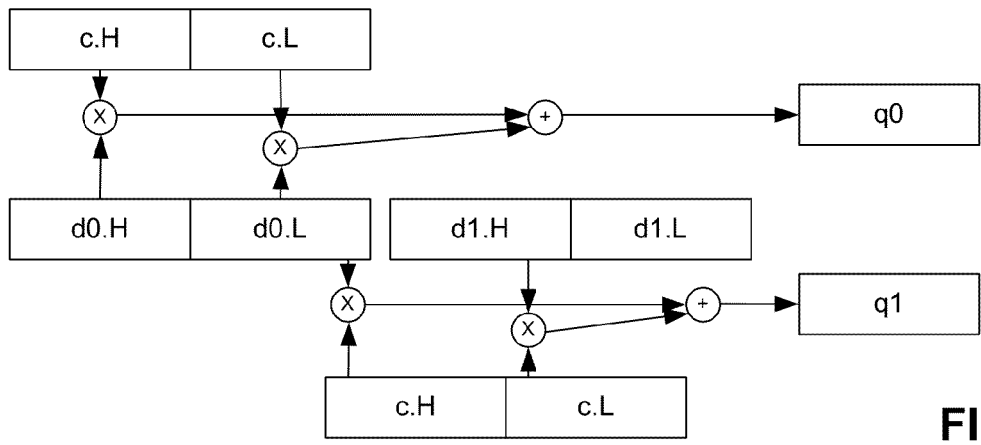
FIG. 8 is a block diagram of an exemplary microprocessor configured to implement multiply-accumulate (MAC) operations of a finite impulse response (FIR) procedure in accordance with one embodiment.
Figure 9:
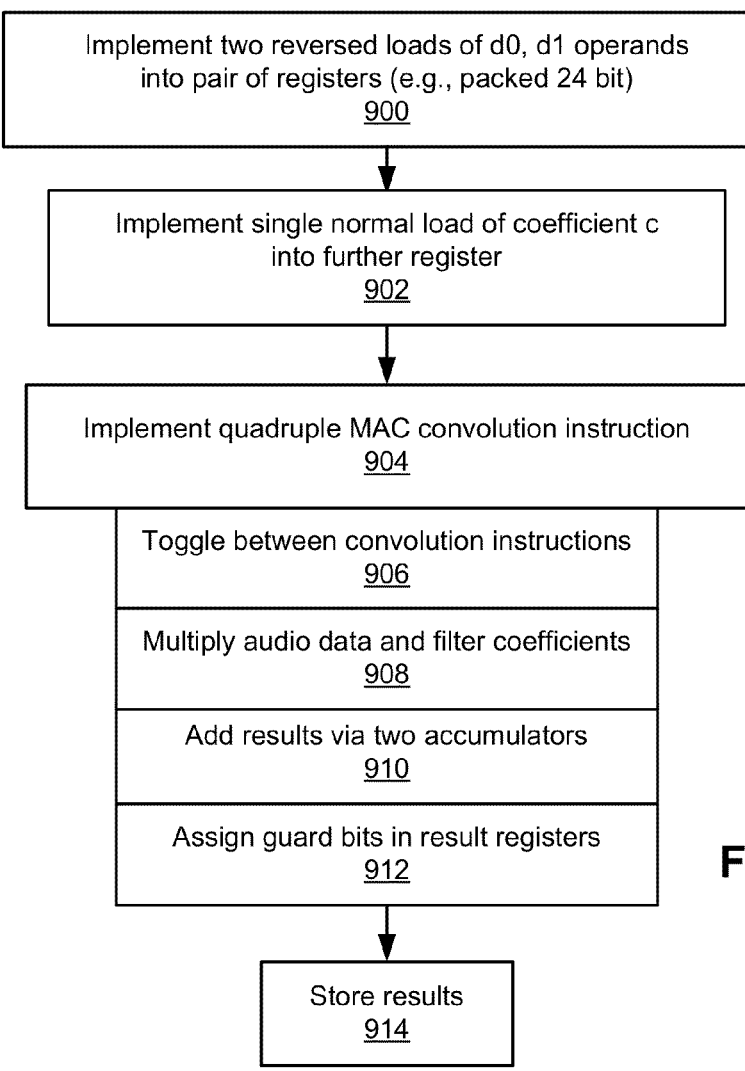
FIG. 9 is a flow diagram of an exemplary method of implementing MAC operations of an FIR procedure in accordance with one embodiment.

FIGS. 8 and 9 depict the control logic of a DSP or other microprocessor implement a number of multiply-accumulate operations involved in the FIR algorithm when using a SIMD architecture. The control logic is configured to implement the FIR filter operation via a convolution instruction. In this example, the convolution instruction is configured in accordance with a two-way SIMD architecture. The control logic may thus be configured for two-way SIMD operations such that the convolution instruction is configured to implement a quadruple multiply-accumulate (MAC) operation. The SIMD width may vary.

As shown in FIG. 8, the DSP includes five registers for holding the operands involved in the operations. Two of the registers, q0 and q1, hold the output data values, which are both read and written during the filter convolution. The other three registers hold operands that are only read during the filter convolution. Two registers, d0 and d1, hold respective pairs of audio data elements, and one register, c, the high and low halves of which hold respective filter coefficients, such as $c[j]$ and $c[j+1]$. In this example, the audio data elements and the filter coefficients are 24-bit data values. Each 24-bit data value may be configured as a 1.23 data value. The multiplication of the audio data elements and the filter coefficients may thus result in the production of two 17.47 signed data values in the output data registers.

As shown in the flow diagram of FIG. 9, the FIR convolution instruction may begin in an act 900 in which two reversed loads are implemented. The act 900 may utilize a reversing load operation as described above to compute $y[i]=y[i]+c[j]*x[M+i-j]+c[j+1]*x[M+i-j-1]$ and $y[i+1]=y[i+1]+c[j]*x[M+i-j+1]+c[j+1]*x[M+i-j]$. For example, after using a reversing load for the audio data elements, the computation is converted into $y[i]=y[i]+c[j]*x[i+j]+c[j+1]*x[i+j+1]$ and $y[i+1]=y[i+1]+c[j]*x[i+j+1]+c[j+1]*x[i+j+2]$. The audio data elements may thus be available in the operand registers in a descending order to facilitate SIMD processing.

In this example, the filter coefficient data set is loaded normally (i.e., without reversing the order of the data elements in the set) into a further register in an act 902. Alternatively, the filter coefficients are loaded in a reversed or flipped order, and the audio data elements are loaded in the non-reversed or normal order.

One or both of the normal and reversed load operations may be implemented in connection with an unpacking instruction in which data elements are extracted from larger, successive data envelopes presented at a memory interface in continuous streams as described above.

After the data values for the various operands are accessed, multiple MAC operations of the convolution instruction are implemented in an act 904. The convolution instruction is configured to increment the output data register q0 by a sum of the two multiplication products shown in FIG. 8. In this example, four MAC operations are implemented in acts 908 and 910 in which the various audio data elements are multiplied against respective filter coefficients, and the products are accumulated in respective accumulators. One of the products multiplies the operands in the high halves of the d0 and c registers, while the other one multiplies the operands in the low halves of the d0 and c registers. The convolution instruction is further configured to increment the output data register q1 by a sum of two further products shown in FIG. 8. These products multiply the operand in a high half of the d1 register and the operand in the low half of the d0 register with the operands in the low and high halves of the c register. The act 904 may be repeated in a loop as shown in FIG. 2, in which, e.g., further audio data elements are loaded and convolved with the filter coefficients until all taps of the FIR filter are finished.

One example of an FIR instruction in the TIE language that implements the converted computation is as follows:

```
operation AE_MULAFD24X2.FIR.H {inout AE_DR q0, inout AE_DR
q1, in AE_DR d0, in AE_DR d1, in AE_DR d2} { } {
    wire [0:0] mul2;
    wire [95:0] vec;
    wire [63:0] coef;
    wire [47:0] m0;
    wire [47:0] m1;
    wire [47:0] m2;
    wire [47:0] m3;
    assign mul2 = mul_S2_function(d0[0]);
    assign vec = {d0, d1[63:32]};
    assign coef = d2;
    assign m0 = TIEmul(vec[87:64], coef[55:32], 1'b1);
    assign m1 = TIEmul(vec[55:32], coef[55:32], 1'b1);
    assign m2 = TIEmul(vec[55:32], coef[23:0], 1'b1);
    assign m3 = TIEmul(vec[23:0], coef[23:0], 1'b1);
    assign q0 = (q0[63:0] + ({{15{m0[47]}}, m0, 1'b0})) +
({{15{m2[47]}}, m2, 1'b0});
    assign q1 = (q1[63:0] + ({{15{m1[47]}}, m1, 1'b0})) +
({{15{m3[47]}}, m3, 1'b0});
}
```

In an alternative embodiment, the reversing load is applied to the filter coefficient data set. The above exemplary instruction assumes a two-way SIMD machine, in which each register holds two 32-bit data elements for a total of 64 bits. The SIMD width and number of bits in each register may vary. In this example, each multiplication uses 24 of the 32-bit length. The extra eighth guard bits are assumed to be empty and are ignored.

Figure 10:
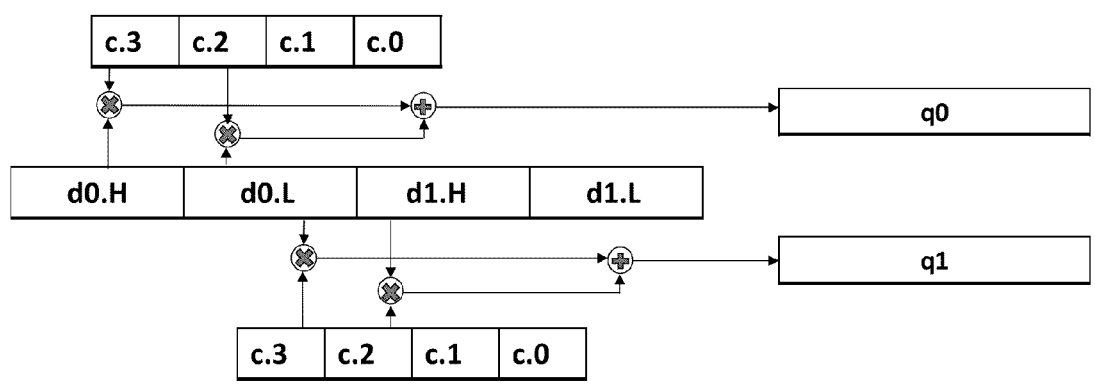
FIG. 10 is a block diagram of an alternative microprocessor configured to implement MAC operations of an FIR procedure involving 32-bit audio data and 16-bit filter coefficient data in accordance with one embodiment.

The above-described FIR convolution instruction may be applied to FIR operations with different bit sizes or with registers that have different number of or no guard bits. As shown in the example of FIG. 10, the FIR convolution instruction may multiply 32-bit numbers (e.g., audio data) with 16-bit numbers (e.g., filter coefficients). The above-described 64-bit registers may hold two, 32-bit numbers or four, 16-bit numbers. When doing a 32×16-bit FIR operation, the filter coefficient, c, may be a 16-bit data element. To implement the 32×16-bit FIR convolution computations on a microprocessor with 64-bit registers, two instructions similar to those above are needed. One of the instructions may take a pair of filter coefficients from the quarters in the high 32 bits of the coefficient operand register and the other instruction may take another pair of filter coefficients from the quarters in the low 32 bits. The operands for the filter coefficients are thus provided by a respective pair of quarters of the c register. In this case, the act 904 includes an act 906 in which the control logic toggles between different convolution instructions, one involving the first pair of quarters of the c register, and the other involving the second pair of quarters of the c register.

Compound Round and Store Operations.

The operands in the multiplication operations described herein may be of a lower precision, such as 16, 24 or 32 bits. Multiplying two 24-bit quantities, for example, produces 48-bit data values. Thus, 48-bit precision may be useful for intermediate calculations. The microprocessor may then be configured with instructions to round the results of such intermediate or other calculations back down to 24-bit data values, e.g., before computing further multiplications in subsequent iterations.

The disclosed embodiments may be configured to implement an instruction that rounds the results of various multiplication operations and stores rounded representations of the results. The disclosed DSPs may thus perform multiplications on lower precision operands (e.g., 24×24-bit or 32×16-bit operands), while maintaining extra precision when doing further computations on the result. Both the 24×24-bit multiplication operations and the 32×16-bit multiplication operations described above produce 48-bit results. Further operations on these 48-bit results may involve the addition of bits. Additional guard bits may be accordingly added to accumulators or other processor components, thereby supporting, e.g., 64-bit values in total. The disclosed embodiments may be configured to efficiently round such 64-bit results back down to 32 or 24 bits when the data values in the accumulators (or elsewhere) are stored to memory.

Figure 11:
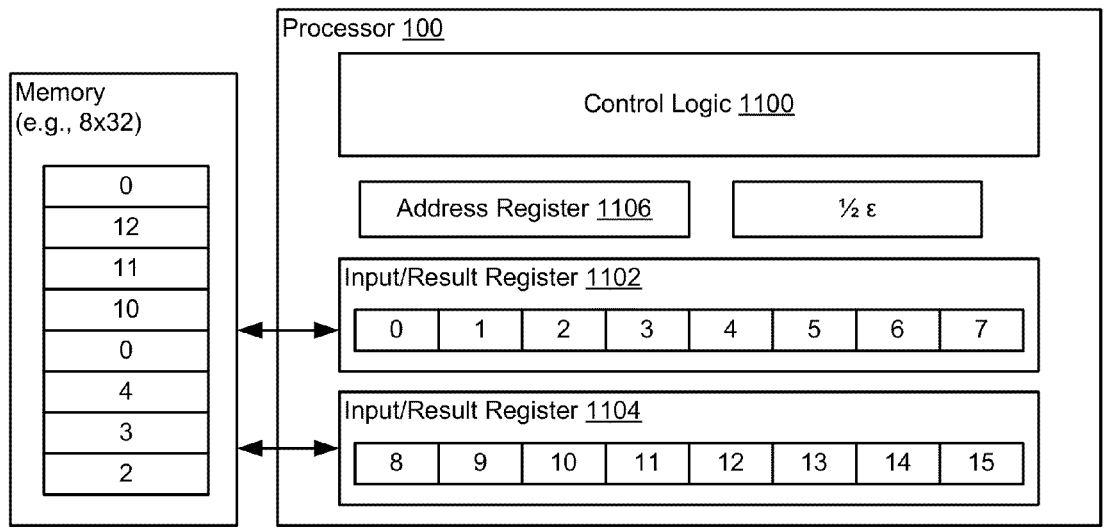
FIG. 11 is a block diagram of an exemplary microprocessor configured to implement a compound round and store operation in accordance with one embodiment.
Figure 12:
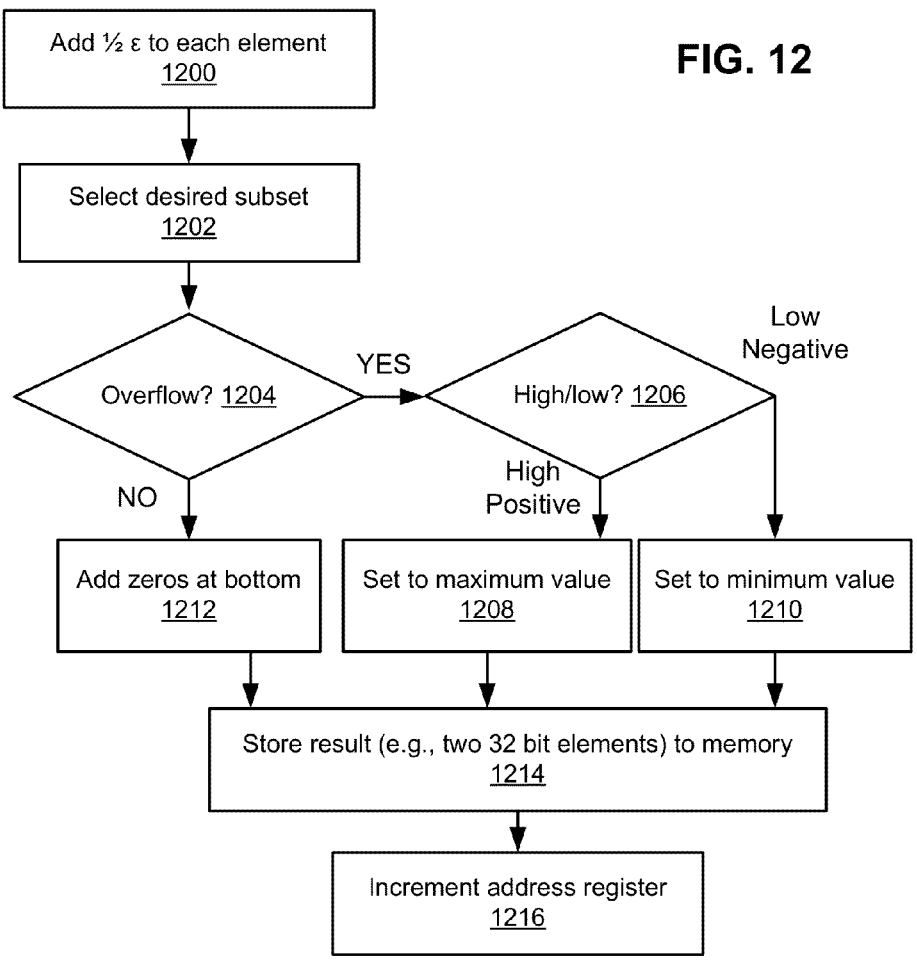
FIG. 12 is a flow diagram of an exemplary method of implementing a compound round and store operation in accordance with one embodiment.

FIGS. 11 and 12 depict the DSP 100 or other microprocessor having control logic 1100 configured to implement a store instruction that rounds and stores a set of data elements in a compound manner. In this example, a pair of data elements held in registers 1102, 1104 are rounded and stored. As shown in the flow diagram of FIG. 12, a rounding constant (e.g., ½ machine epsilon) is added in an act 1200 to each data value.

A subset of the bits from each register 1102, 1104 are then selected in an act 1202 to implement the rounding by, e.g., rounding away a bottom number of bits of each data value. As shown in FIG. 11, three middle bytes are selected in this example. For the data value in the register 1102, bytes {2, 3, 4} are selected for the rounding, while bytes {10, 11, 12} are selected for the other data value. A decision block 1204 then determines whether an overflow condition is present for each data value. The overflow may occur as a result of the rounding or the selection of the subset. A sign-extended guard bit may be used to check for overflow.

If an overflow condition is present, control passes to another decision block 1206 in which it is determined whether the data value is saturated high positive or low negative. Control passes to acts 1208 and 1210 to set the rounded representation to a maximum value or a minimum value accordingly. Otherwise, control passes to an act 1212 in which zeros are added for any bits not filled by the selected subset. The act 1212 may add such zeros as a sign-extended guard bit. The guard bit need not be disposed at a top bit of the rounded representation as shown.

An example of the resulting compound data element (including two scalar data elements, e.g., two 32-bit data values) to be stored after adding the 0 bits is shown in FIG. 11. The compound data element may then be stored to memory in an act 1214 via the memory interface. The compound data element may be written into a respective allocation of the memory interface as shown in FIG. 11 for storage of the data elements collectively in consecutive positions in the memory at a location specified by an address register 1106, which may be incremented in an act 1216.

The above-described compound round and store instruction may be applied in a two-way, 24-bit SIMD machine to store two, 1.23-bit values into memory. For example, two 17.47-bit numbers may be rounded for use in a two-way SIMD architecture into two 1.23-bit numbers, which may then be stored to memory.

The following TIE instruction provides one example of such an operation. The instruction takes two, 64-bit operands. A rounding constant is added to each operand. If overflow is detected, the overflowing result is saturated to either −1 (on negative overflow) or 1−2^−24 on positive overflow. In case of overflow, a global overflow state is set. Because for this operation, 24-bit values are stored in memory using 32-bit envelopes or bundles, the bottom 8-bits of each element in the pair are set to zero. The resultant SIMD data element pair is stored to memory at the address given by an address register a. That register is incremented by 8 bytes so that subsequent stores can store to successive locations.

One example of a compound round and store instruction in the TIE language is as follows:

```
operation AE_S24X2RA64S.IP {in AE_DR v2, in AE_DR v1, inout AR *a} {out VAddr, out MemDataOut64, inout AE_OVERFLOW} {
    wire [31:0] i;
    wire [32:0] vaddr;
    wire [32:0] new_vaddr;
    wire [64:0] round_v;
    wire [64:0] rounded_temp1;
    wire [64:0] rounded_temp2;
    wire [0:0] oflow1;
    wire [0:0] oflow2;
    wire [0:0] uflow1;
    wire [0:0] uflow2;
    wire [23:0] rounded_value1;
    wire [23:0] rounded_value2;
    wire [23:0] max_v;
    wire [23:0] min_v;
    wire [23:0] saturated_data1;
    wire [23:0] saturated_data2;
    wire [31:0] store_data1;
    wire [31:0] store_data2;
    assign i = 32'h8;
    assign vaddr = {1'b0, a};
    assign VAddr = vaddr[31:0];
    assign new_vaddr = vaddr + ({i[31], i});
    assign a = new_vaddr[31:0];
    assign round_v = 65'h1 << 32'h17;
    assign rounded_temp1 = ({v1[63], v1[63:0]}) + round_v;
    assign rounded_temp2 = ({v2[63], v2[63:0]}) + round_v;
    assign oflow1 = (~rounded_temp1[64]) & (|rounded_temp1[63:47]);
    assign oflow2 = (~rounded_temp2[64]) & (|rounded_temp2[63:47]);
    assign uflow1 = rounded_temp1[64] & (~&rounded_temp1[63:47]);
    assign uflow2 = rounded_temp2[64] & (~&rounded_temp2[63:47]);
    assign rounded_value1 = rounded_temp1[47:24];
    assign rounded_value2 = rounded_temp2[47:24];
    assign max_v = {1'b0, {23{1'b1}}};
    assign min _v = ~max_v;
    assign saturated_data1 = oflow1 ? max_v : (uflow1 ? min_v :
```

-continued

```
rounded_value1);
    assign saturated_data2 = oflow2 ? max_v : (uflow2 ? min_v :
rounded_value2);
    assign store_data1 = {saturated_data1, 8'b0};
    assign store_data2 = {saturated_data2, 8'b0};
    assign AE_OVERFLOW = (((AE_OVERFLOW | oflow1) | oflow2) |
uflow1) | uflow2;
    assign MemDataOut64 = {store_data1, store_data2};
}
```

Other embodiments may round data elements of different sizes and/or be configured to round down to a different size. For example, two 17.47-bit values may be rounded into two 1.31-bit values. The operation rounds away the bottom 16 bits rather than the bottom 24 bits. Because there are no extra bits in memory, no bits in the result register are set to zero.

In some embodiments, writing each selected subset in the act 1214 includes implementing a packed store instruction, as described above, to write each selected subset into the memory interface without space between consecutive selected subsets.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A microprocessor comprising:
a memory interface to load or store data envelopes from or to a memory, each data envelope having a first length;
a plurality of registers;
a buffer; and
control logic configured to implement a plurality of instructions to load or store a stream of data elements via a succession of the data envelopes at the memory interface, each data element having a second length in one of the plurality of registers shorter than the first length of the data envelopes at the memory interface, the first length not being an integer multiple of the second length, the plurality of instructions comprising:
an initialization instruction configured to initialize the buffer in a load operation in which an initial envelope is loaded into the buffer, the initial envelope comprising a first byte of a first data element of the stream of data elements, or in a store operation in which the buffer is cleared; and
a data merge instruction configured to extract or incorporate a respective data element from or into the stream of data elements in the load operation or the store operation, respectively, wherein the data merge instruction is configured to merge current contents of the buffer and the memory interface into a first register of the plurality of registers in the load operation or is configured to merge current contents of the buffer and a second register of the plurality of registers into the memory interface in the store operation, and is further configured to move at least a remainder of the current contents of either the memory interface or the second register into the buffer for use in a successive invocation of the data merge instruction.

2. The microprocessor of claim 1, further comprising an address register for the memory interface, wherein the data merge instruction is further configured to increment the address register in accordance with the second length.

3. The microprocessor of claim 1, wherein the plurality of instructions further comprise a flush instruction configured to flush any data remaining in the buffer upon reaching an end of the stream of data elements to be stored during implementation of the store operation.

4. The microprocessor of claim 1, wherein the data merge instruction is further configured to determine whether, in the load operation, the buffer includes an entire representation of the data element such that no further data is required from the memory interface, or whether, in the store operation, whether any further data is moved to the memory interface.

5. The microprocessor of claim 1, wherein each data element is a vector data element comprising multiple data values.

6. The microprocessor of claim 5, wherein the first length is 64 bits and the second length is 48 bits, and wherein each data element is a vector data element comprising a pair of 24-bit scalar data elements.

7. The microprocessor of claim 1, wherein each register has a size greater than the second length to provide space for one or more guard bits.

8. The microprocessor of claim 1, wherein the data merge instruction is further configured in the load operation to set extra bits in the first register to sign-extended values.

9. The microprocessor of claim 1, wherein the first length is 32 bits and the second length is 24 bits.

10. A method of loading or storing a stream of data elements to or from a microprocessor, respectively, via a succession of data envelopes at a memory interface of the microprocessor, each data envelope having a first length, each data element of the stream of data elements having a second length in one of a plurality of registers of the microprocessor shorter than the first length, the first length not being an integer multiple of the second length, the method comprising:
  initializing a buffer of the microprocessor in a store operation in which the buffer is cleared, or in a load operation in which an initial data envelope of the succession is loaded into the buffer, the initial data envelope comprising a first byte of a first data element of the stream of data elements;
  merging, in the load operation, current contents of the buffer and the memory interface in the load operation to extract a respective data element from the stream of data elements into a first register of the plurality of registers, or in the store operation, current contents of the buffer and a second register of the plurality of registers to incorporate a respective data element into the stream at the memory interface; and
  moving at least a remainder of the current contents of either the memory interface or the second register into the buffer for use in a successive implementation of the load operation or the store operation.

11. The method of claim 10, further comprising incrementing an address register of the microprocessor for the memory interface in accordance with the second length.

12. The method of claim 10, further comprising flushing any data remaining in the buffer upon reaching an end of the stream of data elements to be stored in implementation of the store operation.

13. The method of claim 10, wherein merging the current contents of the buffer and the memory interface comprises determining, whether, in the load operation, the buffer includes an entire representation of the data element such that no further data is required from the memory interface, or whether, in the store operation, whether any further data is moved to the memory interface.

14. A non-transitory computer-readable storage medium including instructions defining logic blocks of a microprocessor, the instructions being configured for use by an electronic design application executed by a computer to design the microprocessor, wherein the logic blocks are configured to implement a method of loading or storing a stream of data elements via a succession of data envelopes at a memory interface of the microprocessor, each data envelope having a first length, each data element of the stream of data elements having a second length in one of a plurality of registers of the microprocessor shorter than the first length, the first length not being an integer multiple of the second length, the method comprising:
  initializing a buffer of the microprocessor in a store operation in which the buffer is cleared, or in a load operation in which an initial data envelope of the succession is loaded into the buffer, the initial envelope comprising a first byte of a first data element of the stream of data elements;
  merging, in the load operation, current contents of the buffer and the memory interface in the load operation to unpack a respective data element from successive locations in the stream of data elements into a first register of the plurality of registers, or in the store operation, current contents of the buffer and a second register of the plurality of registers to pack a respective data element into successive locations in the stream at the memory interface; and
  moving at least a remainder of the current contents of either the memory interface or the second register into the buffer for use in a successive implementation of the load operation or the store operation.

15. The computer-readable storage medium of claim 14, wherein merging the current contents of the buffer and the memory interface comprises determining, whether, in the load operation, the buffer includes an entire representation of the data element such that no further data is required from the memory interface, or whether, in the store operation, whether any further data is moved to the memory interface.

16. A microprocessor comprising:
  a memory interface to obtain data envelopes of a first length;
  a plurality of registers;
  a buffer; and
  control logic configured to implement a plurality of instructions comprising:
    a first instruction configured to load an initial data envelope of a stream of data values into the buffer, each data value having a second length shorter than the first length, the stream of data values being disposed continuously across successive data envelopes obtained via the memory interface;
    a second instruction configured to merge current contents of the buffer and the memory interface such that each invocation of the second instruction loads a respective one of the stream of data values into a first register of the plurality of registers, and wherein the second instruction is configured to move at least a remainder of the current contents of the memory interface into the buffer for use in a successive invocation of the second instruction;

a third instruction configured to load a reversed representation of a set of data values obtained via the memory interface into a second register of the plurality of registers, the reversed representation reversing an order of elements in the set; and a fourth instruction configured to implement a finite impulse response (FIR) computation comprising a single-instruction, multiple data (SIMD) operation involving multiple data values of the stream of data values loaded via the second instruction and the reversed representation of the set of data values in the second register.

17. The microprocessor of claim 16, wherein the plurality of instructions further comprises a fifth instruction configured to round and store multiple output data values of the FIR computation via the memory interface by adding a rounding constant to each output data value, selecting a subset of bits from a respective result register of the plurality of registers in which the respective output data value is held, and writing each selected subset into a respective allocation of the memory interface.

18. The microprocessor of claim 17, wherein the fifth instruction is configured to pack each selected subset into the memory interface without space between consecutive selected subsets and without assigning one or more guard bits, the memory interface having a length that does not correspond to a multiple of a length of each selected subset.

19. The microprocessor of claim 16, wherein the data values in the stream of data values are indicative of audio data values and the data values in the set of data values are indicative of FIR filter coefficients.

20. The microprocessor of claim 16, wherein each register in the plurality of registers has a length equal to the first length.

21. The microprocessor of claim 16, wherein the second instruction is configured to unpack the set of data values from a continuous stream at the memory interface.

22. The microprocessor of claim 16, wherein the fourth instruction is configured to implement multiple multiply-accumulate (MAC) operations involving the stream of data values and the reversed representation of the vector of data values.

23. The microprocessor of claim 16, wherein the plurality of instructions further comprise a fifth instruction configured to round results of the multiple MAC operations and provide the rounded results in a composite data envelope of the first length to the memory interface for storage.

24. The microprocessor of claim 16, wherein the initial data envelope comprises at least a first byte of the initial data value.

25. A method for implementing a finite impulse response (FIR) filter using a microprocessor having a memory interface to obtain data envelopes of a first length, a buffer, and a plurality of registers, the method comprising:

loading an initial data envelope of a stream of data values into the buffer, each data value having a second length shorter than the first length, the stream of data values being disposed continuously across successive data envelopes obtained via the memory interface;

merging current contents of the buffer and the memory interface such that a respective one of the data values is loaded into a first register of the plurality of registers;

moving at least a remainder of the current contents of the memory interface into the buffer for use in loading a successive data value in the stream of data values;

loading reversed representations of a set of data values obtained via the memory interface into a second register of the plurality of registers, the reversed representation reversing an order of elements in the set; and implementing a plurality of multiply-accumulate (MAC) operations convolving respective data values of the stream of data values and the reversed representations of the set of data values.

26. The method of claim 25, further comprising rounding and storing multiple output data values of the plurality of MAC operations via the memory interface, wherein rounding and storing comprises:

adding a rounding constant to each output data value;

selecting a subset of bits from a respective result register of the plurality of registers in which the respective output data value is held; and writing each selected subset into a respective allocation of the memory interface.

27. The method of claim 26, wherein writing each selected subset comprises packing each selected subset into the memory interface without space between consecutive selected subsets and without assigning one or more guard bits, the memory interface having a length that does not correspond to a multiple of a length of each selected subset.

28. The method of claim 25, wherein the data values in the stream of data values are indicative of audio data values and the data values in the set of data values are indicative of FIR filter coefficients.

29. The method of claim 25, wherein each register in the plurality of registers has a length equal to the first length.

30. The method of claim 25, wherein loading the reversed representations comprises unpacking the set of data values from a continuous stream at the memory interface.

31. The method of claim 25, further comprising rounding results of the plurality of MAC operations and providing the rounded results in a composite data envelope of the first length to the memory interface for storage.

32. The method of claim 25, wherein the initial data envelope comprises at least a first byte of the initial data value.

33. A non-transitory computer-readable storage medium including instructions defining logic blocks of a microprocessor having a memory interface to obtain data envelopes of a first length, a buffer, and a plurality of registers, the instructions being configured for use by an electronic design application executed by a computer to design the microprocessor, wherein the logic blocks are configured to implement a method comprising:

loading an initial data envelope of a stream of data values into the buffer, each data value having a second length shorter than the first length, the stream of data values being disposed continuously across successive data envelopes obtained via the memory interface;

merging current contents of the buffer and the memory interface such that a respective one of the data values is loaded into a first register of the plurality of registers;

moving at least a remainder of the current contents of the memory interface into the buffer for use in loading a successive data value in the stream of data values;

loading reversed representations of a set of data values obtained via the memory interface into a second register of the plurality of registers, the reversed representation reversing an order of elements in the set; and implementing a plurality of multiply-accumulate (MAC) operations convolving respective data values of the stream of data values and the reversed representations of the set of data values, the plurality of MAC operations comprising a single-instruction, multiple data (SIMD) operation.

34. The computer-readable storage medium of claim 33, further comprising rounding and storing multiple output data values of the plurality of MAC operations via the memory interface, wherein rounding and storing comprises:
- adding a rounding constant to each output data value;
- selecting a subset of bits from a respective result register of the plurality of registers in which the respective output data value is held; and
- writing each selected subset into a respective allocation of the memory interface.

* * * * *